US010580901B2

(12) United States Patent
Balakrishnan et al.

(10) Patent No.: US 10,580,901 B2
(45) Date of Patent: Mar. 3, 2020

(54) STACKED SERIES CONNECTED VFETS FOR HIGH VOLTAGE APPLICATIONS

(71) Applicant: International Business Machines Corporation, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 33 days.

(21) Appl. No.: 15/255,621

(22) Filed: Sep. 2, 2016

(65) Prior Publication Data

US 2018/0069131 A1     Mar. 8, 2018

(51) Int. Cl.
 H01L 27/12   (2006.01)
 H01L 21/336  (2006.01)
 H01L 29/786  (2006.01)
 H01L 29/66   (2006.01)
 H01L 29/423  (2006.01)
 H01L 29/06   (2006.01)

(52) U.S. Cl.
 CPC .... H01L 29/78642 (2013.01); H01L 29/0653 (2013.01); H01L 29/42392 (2013.01); H01L 29/66666 (2013.01); H01L 29/78618 (2013.01); H01L 29/78696 (2013.01)

(58) Field of Classification Search
 CPC ...... H01L 29/786; H01L 21/336; H01L 27/12

USPC ........ 257/369, 327, 347; 438/197, 151, 300, 438/479
See application file for complete search history.

(56) References Cited

U.S. PATENT DOCUMENTS

| | | | | |
|---|---|---|---|---|
| 2005/0242395 | A1* | 11/2005 | Chen ................. | H01L 29/66628 257/347 |
| 2010/0181615 | A1* | 7/2010 | Ikebuchi ......... | H01L 21/823487 257/329 |
| 2011/0049613 | A1* | 3/2011 | Yeh .................... | H01L 29/66795 257/327 |
| 2011/0079841 | A1* | 4/2011 | Masuoka ........ | H01L 21/823885 257/329 |
| 2011/0291188 | A1* | 12/2011 | Cheng .................. | H01L 29/785 257/347 |
| 2012/0001197 | A1* | 1/2012 | Liaw ...................... | H01L 27/11 257/77 |

(Continued)

OTHER PUBLICATIONS

Cai et al. "SOI Series MOSFET for Embedded High Voltage Applications and Soft-Error Immunity," 2008 IEEE International SOI Conference Proceedings, pp. 21-22.

*Primary Examiner* — Sheng-Bai Zhu
(74) *Attorney, Agent, or Firm* — Cantor Colburn LLP; L. Jeffrey Kelly

(57) ABSTRACT

A method of forming a semiconductor device and resulting structures having stacked vertical field effect transistors (VFETs) connected in series. A first semiconductor fin and a second semiconductor fin are formed on a doped region of a substrate. A shared gate is formed over a channel region of the first semiconductor fin and a channel region of the second semiconductor fin. A shared epitaxy region is formed on a surface of the first semiconductor fin and a surface of the second semiconductor fin.

11 Claims, 24 Drawing Sheets

(56) References Cited

U.S. PATENT DOCUMENTS

2012/0074495 A1* 3/2012 Ou ...................... H01L 27/1211
   257/350
2013/0001705 A1* 1/2013 Su ................... H01L 21/823431
   257/401

* cited by examiner

STACKED SERIES CONNECTED VFETS FOR HIGH VOLTAGE APPLICATIONS

BACKGROUND

The present invention relates in general to semiconductor device fabrication methods and resulting structures. More specifically, the present invention relates to fabrication methods and resulting structures for a semiconductor device having stacked vertical field effect transistors (VFETs) connected in series.

In contemporary semiconductor device fabrication processes, a large number of semiconductor devices, such as field effect transistors (FETs), are fabricated on a single wafer. Some non-planar transistor device architectures, such as VFETs, employ semiconductor fins and side-gates that can be contacted outside the active region, resulting in increased device density and performance over lateral devices. In contemporary VFET devices, in contrast to conventional FETs, the source to drain current flows through a vertical pillar in a direction that is perpendicular with respect to a horizontal major surface of the wafer or substrate. A VFET can achieve a smaller device footprint because its channel length is not defined by lithography, but rather by methods such as epitaxial growth or layer deposition, which can provide thickness control even at nanometer dimensions.

SUMMARY

According to embodiments of the present invention, a method of fabricating a semiconductor device having stacked VFETs connected in series is provided. The method can include forming a first semiconductor fin and a second semiconductor fin on a doped region of a substrate. A shared gate is formed over a channel region of the first semiconductor fin and a channel region of the second semiconductor fin. A shared epitaxy region is formed on a surface of the first semiconductor fin and a surface of the second semiconductor fin.

According to embodiments of the present invention, a method of fabricating a semiconductor device having stacked VFETs connected in series is provided. The method can include forming a first semiconductor fin on a first portion of a doped region of a substrate and forming a second semiconductor fin on a second portion of the doped region of the substrate. A gate is formed over a channel region of the first semiconductor fin and a channel region of the second semiconductor fin. A first epitaxy region is formed on a surface of the first semiconductor fin and a second epitaxy region is formed on a surface of the second semiconductor fin. The first and the second epitaxy regions are grown until the first epitaxy region merges with the second epitaxy region to define a shared epitaxy region.

According to embodiments of the present invention, a structure having stacked VFETs connected in series is provided. The structure can include a first semiconductor fin and a second semiconductor fin formed on a doped region of a substrate. A shared gate is formed over a channel region of the first semiconductor fin and a channel region of the second semiconductor fin. A shared epitaxy region is formed over a surface of the first semiconductor fin and a surface of the second semiconductor fin.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
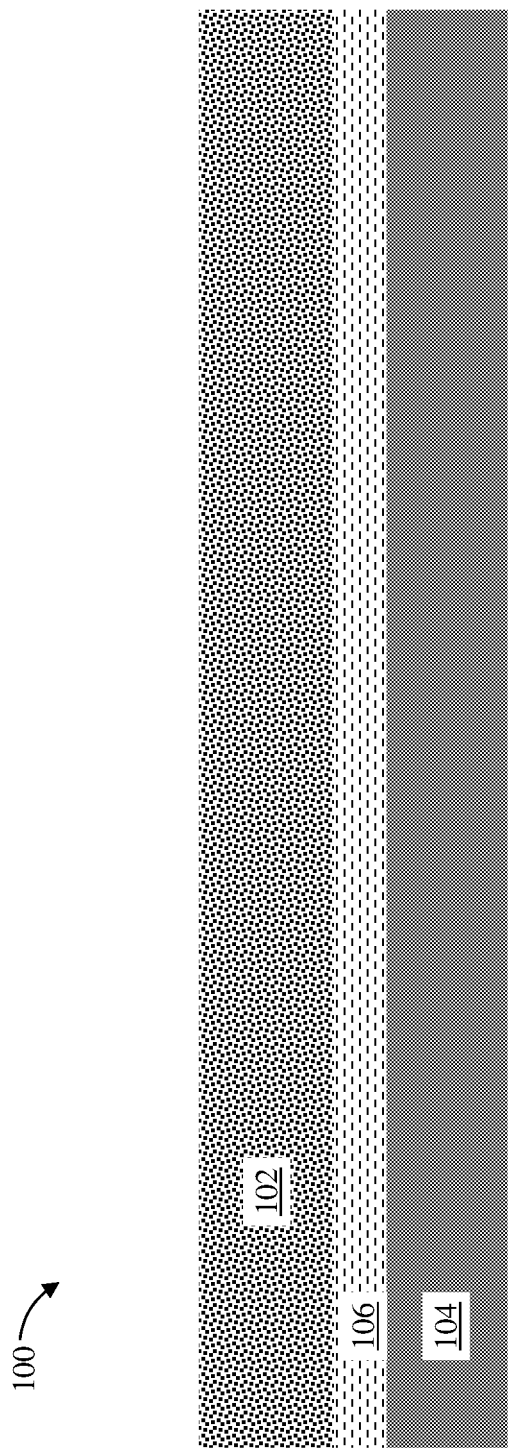
FIG. 1 depicts a cross-sectional view of a structure having a doped layer formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having stacked VFETs connected in series according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon oxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, some non-planar transistor device architectures, such as VFETs, employ semiconductor fins and side-gates that can be contacted outside the active region, resulting in increased device density over lateral devices. However, there are challenges to providing VFETs with equal or superior performance characteristics to lateral devices. One such challenge, for example, arises from the relative differences in power supply voltage requirements between VFETs and I/O devices. VFETs are typically designed for use with relatively low power supply voltages of less than about 1 volt. I/O devices, however, require relatively higher power supply voltages. Some I/O devices can require a power supply voltage significantly greater than 1 volt. Thus, a method and structure is desired for VFETs capable of operating with a significantly larger power supply voltage.

Turning now to an overview of aspects of the present invention, one or more embodiments provide methods of fabricating a semiconductor device having stacked VFETs. The phrase "stacked VFET" is used herein to identify VFETs that are connected in series and operated as a single transistor. Stacked VFETs connected in series provide a long channel current flow and are capable of operating with a significantly larger power supply voltage than typical VFETs. The described methods form a shared gate over channel regions of adjacent semiconductor fins and form a shared epitaxy region contacting a surface of each of the adjacent semiconductor fins. Methods for fabricating a semiconductor device having stacked VFETs connected in series and the resulting structures therefrom in accordance with embodiments of the present invention are described in detail below by referring to the accompanying drawings in FIGS. 1-24.

FIG. 1 illustrates a cross-sectional view of a structure 100 having a doped layer 102 formed on a substrate 104 during an intermediate operation of a method of fabricating a semiconductor device according to one or more embodiments. The doped layer 102 can be a source or drain region formed in the substrate 104 by a variety of methods, such as, for example, in-situ epitaxy, diffusion, ion implantation, solid phase doping, gas phase doping, and plasma doping. In some embodiments, the doped layer 102 is a heavily p-type doped layer. The substrate 104 can be any suitable substrate material, such as, for example, monocrystalline Si, SiGe, SiC, III-V compound semiconductor, II-VI compound semiconductor, or semiconductor-on-insulator (SOI). In some embodiments, a counter-doped layer 106 is formed between the doped layer 102 and the substrate 104. Any known composition and manner of forming the counter-doped layer 106 can be utilized.

Figure 2:
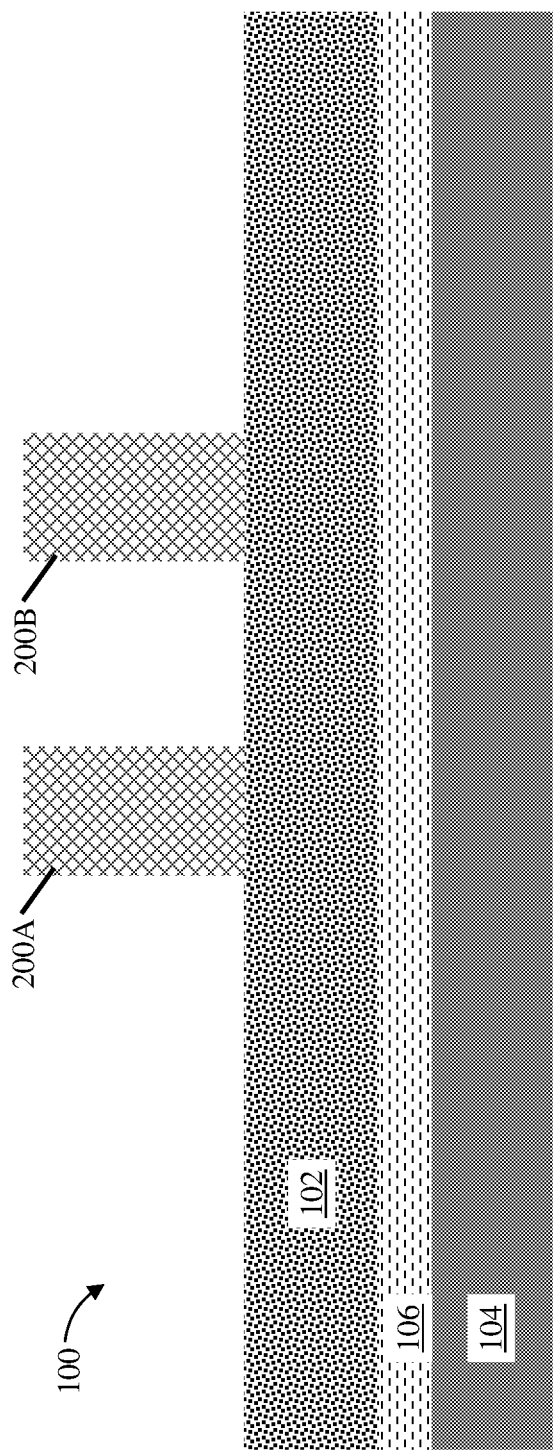
FIG. 2 depicts a cross-sectional view of the structure after forming sacrificial fins on the doped layer according to one or more embodiments of the present invention.

FIG. 2 illustrates a cross-sectional view of the structure 100 after forming sacrificial fins 200A and 200B on the doped layer 102. Any known composition and manner of forming the sacrificial fins 200A and 200B can be utilized. In some embodiments, the sacrificial fins 200A and 200B are patterned by a sidewall image transfer (SIT) operation. In still other embodiments, the sacrificial fins 200A and 200B are patterned using a wet or dry etching operation to selectively remove portions of a sacrificial material. In some embodiments, the etching operation is a RIE etch selective to the doped layer 102.

Figure 3:
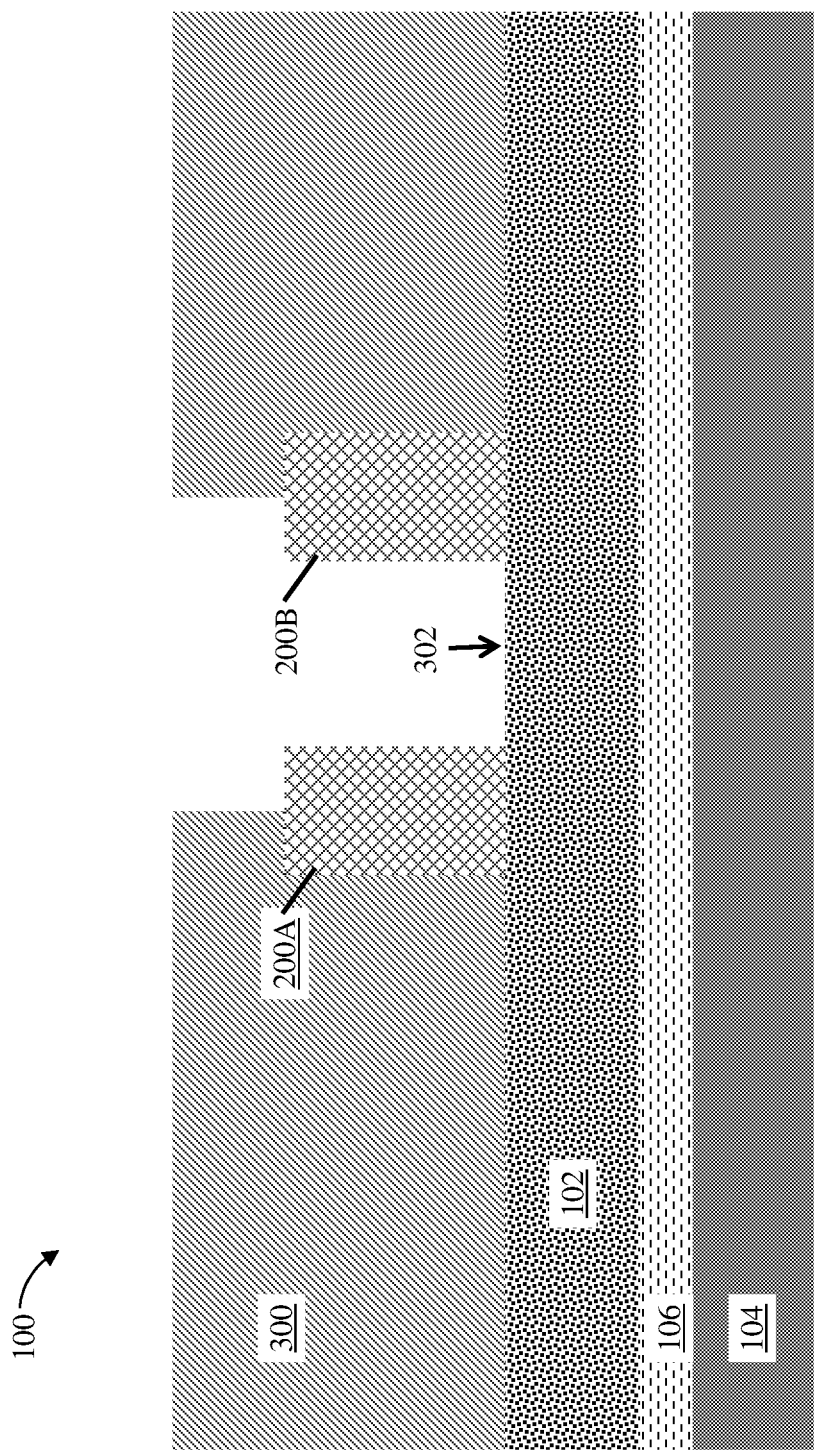
FIG. 3 depicts a cross-sectional view of the structure after forming a cut mask over the doped layer according to one or more embodiments of the present invention.

FIG. 3 illustrates a cross-sectional view of the structure 100 after forming a cut mask 300 over the doped layer 102. Any known composition and manner of forming the cut mask 300 can be utilized. The cut mask 300 is patterned to expose a surface 302 of the doped layer 102.

Figure 4:
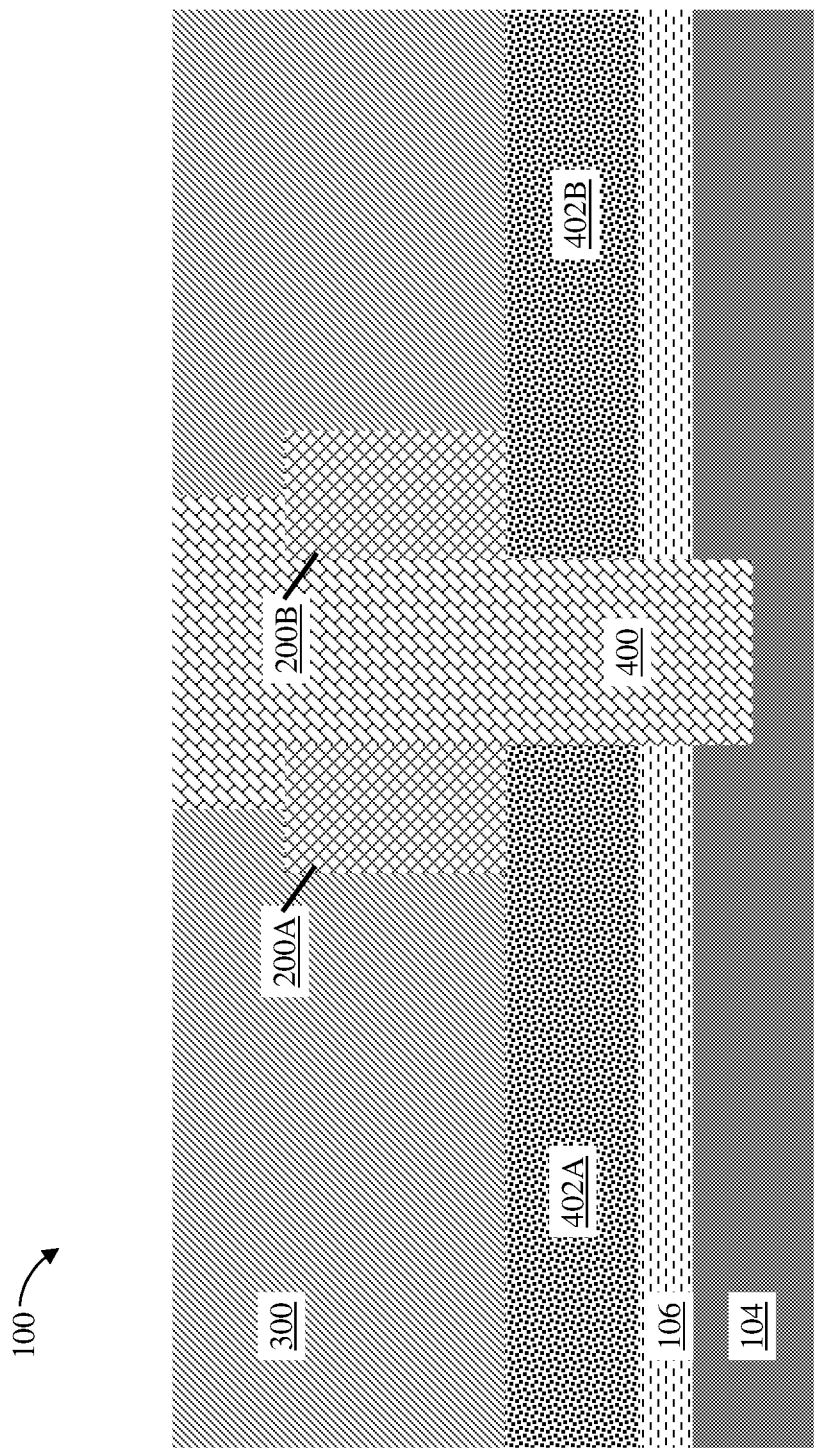
FIG. 4 depicts a cross-sectional view of the structure after removing portions of the doped layer, portions of the counter-doped layer, and portions of the substrate under the exposed surface of the doped layer according to one or more embodiments of the present invention.

FIG. 4 illustrates a cross-sectional view of the structure 100 after removing portions of the doped layer 102, portions of the counter-doped layer 106, and portions of the substrate 104 under the exposed surface 302 of the doped layer 102. In some embodiments, a RIE etch is used to remove the portions of the doped layer 102, the counter-doped layer 106, and the substrate 104 to form a recess. A dielectric isolation layer 400 is formed within the recess to replace the removed portions of the doped layer 102, the counter-doped layer 106, and the substrate 104. The dielectric isolation layer 400 serves as a shallow trench isolation (STI) region by separating the doped layer 102 into a first portion 402A and a second portion 402B. A STI region prevents electrical current leak between adjacent semiconductor device components. The dielectric isolation layer 400 can be of any suitable material, such as, for example, an oxide. In some embodiments, the dielectric isolation layer 400 overfills the recess and a CMP selective to the cut mask 300 is used to remove any excess portion of the dielectric isolation layer 400 (known as overburden) that extends above a top surface of the cut mask 300.

Figure 5:
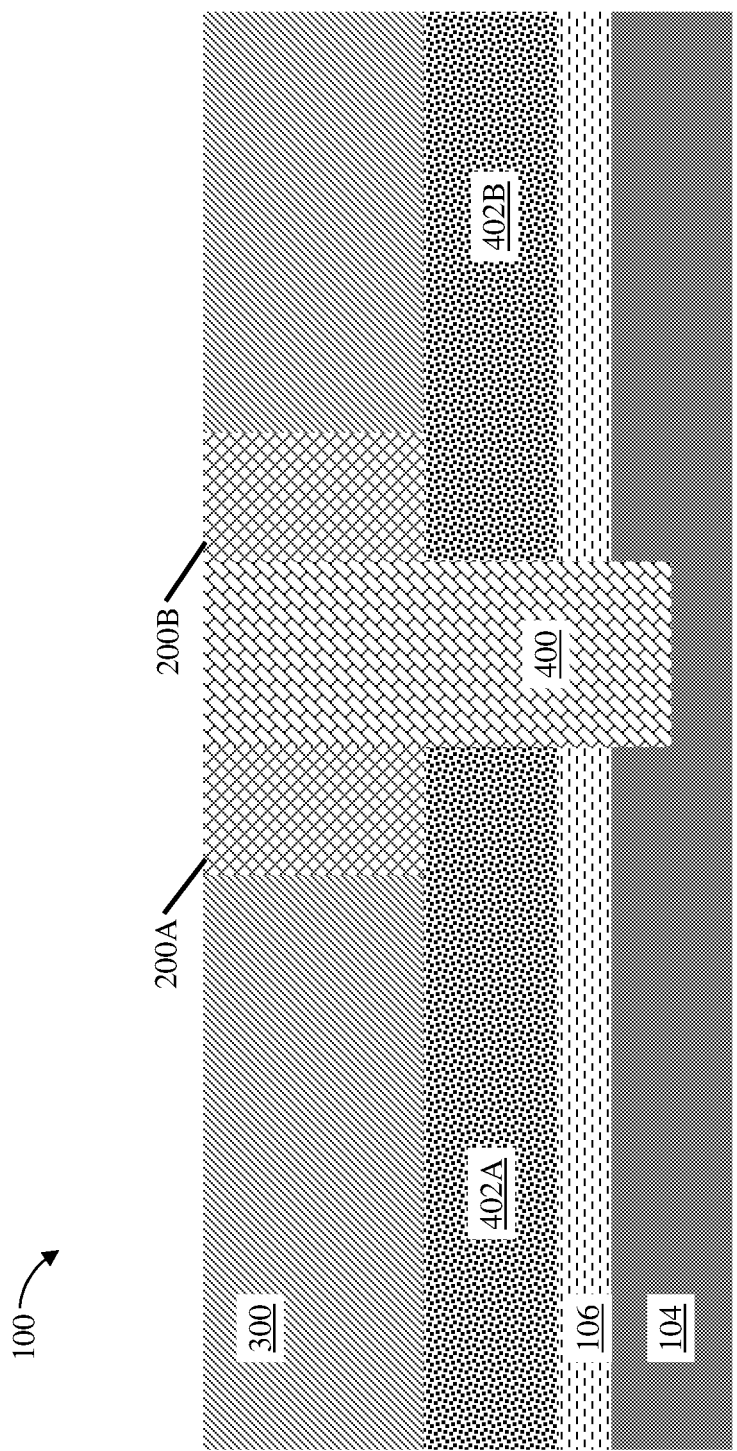
FIG. 5 depicts a cross-sectional view of the structure after a CMP has removed portions of the dielectric isolation layer and portions of the cut mask that extend above a top surface of the sacrificial fins according to one or more embodiments of the present invention.

FIG. 5 illustrates a cross-sectional view of the structure 100 after a CMP selective to the sacrificial fins 200A and 200B is used to remove portions of the dielectric isolation layer 400 and portions of the cut mask 300 that extend above a top surface of the sacrificial fins 200A and 200B.

Figure 6:
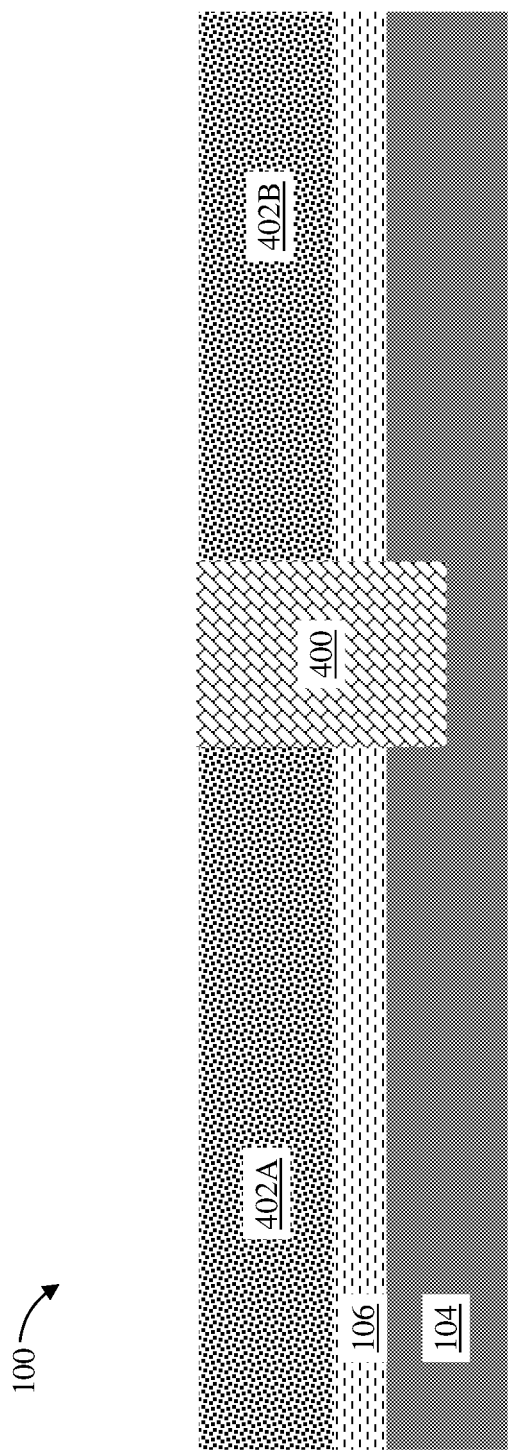
FIG. 6 depicts a cross-sectional view of the structure after a CMP has exposed a top surface of the first portion and the second portion of the doped layer according to one or more embodiments of the present invention.

FIG. 6 illustrates a cross-sectional view of the structure 100 after a CMP selective to the doped layer 102 is used to remove the sacrificial fins 200A and 200B as well as portions of the dielectric isolation layer 400 and portions of the cut mask 300 to expose a top surface of the first portion 402A and the second portion 402B of the doped layer 102.

Figure 7:
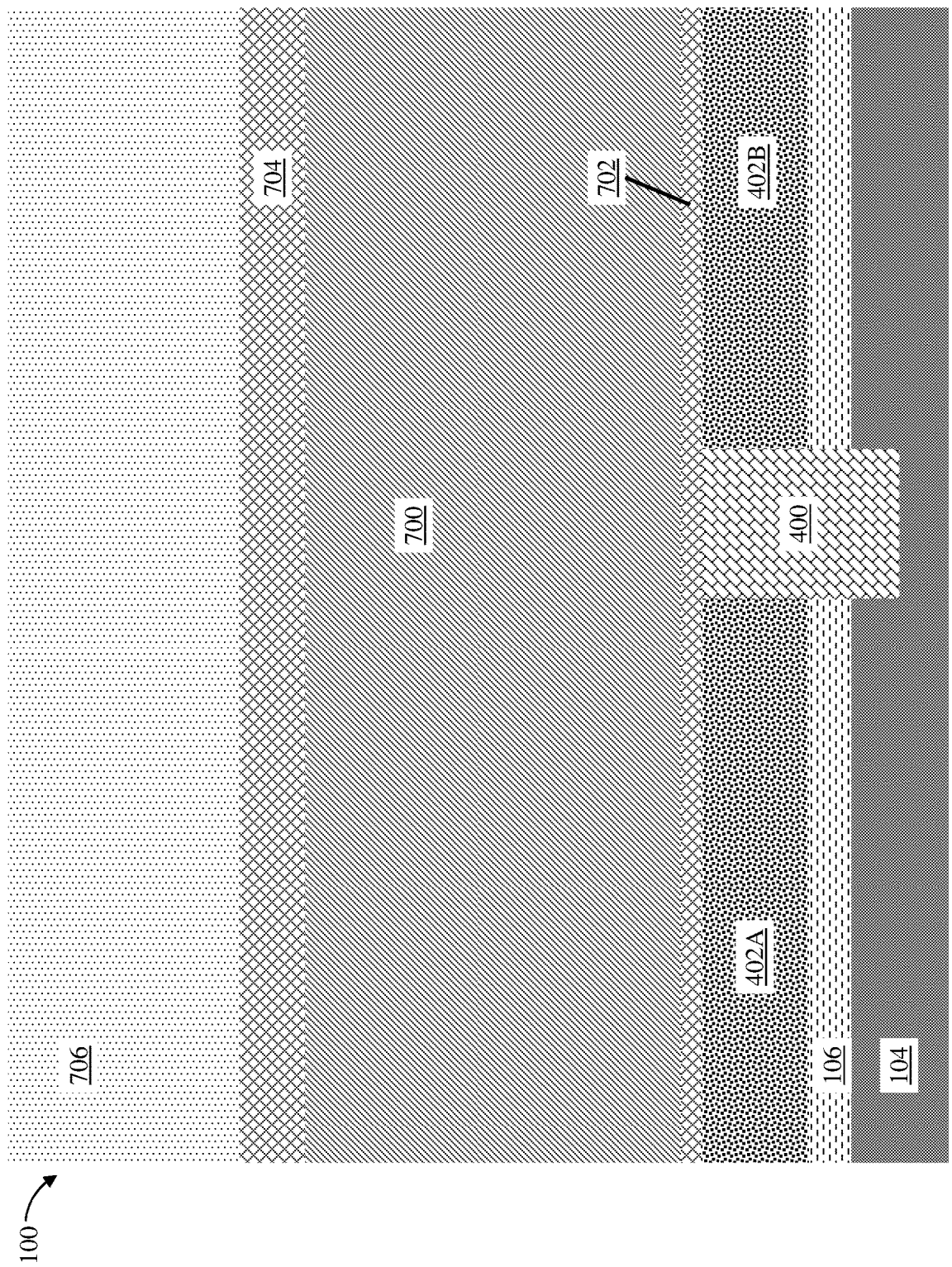
FIG. 7 depicts a cross-sectional view of the structure after forming a sacrificial gate between a bottom spacer and a top spacer on the doped layer and the dielectric isolation layer according to one or more embodiments of the present invention.

FIG. 7 illustrates a cross-sectional view of the structure 100 after forming a sacrificial gate 700 between a bottom spacer 702 and a top spacer 704 on the doped layer 102 and the dielectric isolation layer 400. Any known composition and manner of forming the sacrificial gate 700 can be utilized. In some embodiments, the sacrificial gate 700 can be amorphous silicon (a-Si) or polycrystalline silicon (poly-Si). Any known manner of forming the bottom spacer 702 and the top spacer 704 can be utilized. In some embodiments, the bottom spacer 702 and the top spacer 704 are each deposited using CVD, PECVD, ALD, PVD, chemical solution deposition, or other like processes. The bottom spacer 702 and the top spacer 704 can be of any suitable material, such as, for example, a low-k dielectric, a nitride, silicon nitride, silicon oxide, a silicon oxynitride (SiON), a silicon carbide (SiC), a silicon oxygen carbonitride (SiOCN), or a silicoboron carbonitride (SiBCN). In some embodiments, the bottom spacer 702 and the top spacer 704 are different materials. A sacrificial layer 706 is formed on the top spacer 704. In some embodiments, the sacrificial layer 706 is an oxide.

Figure 8:
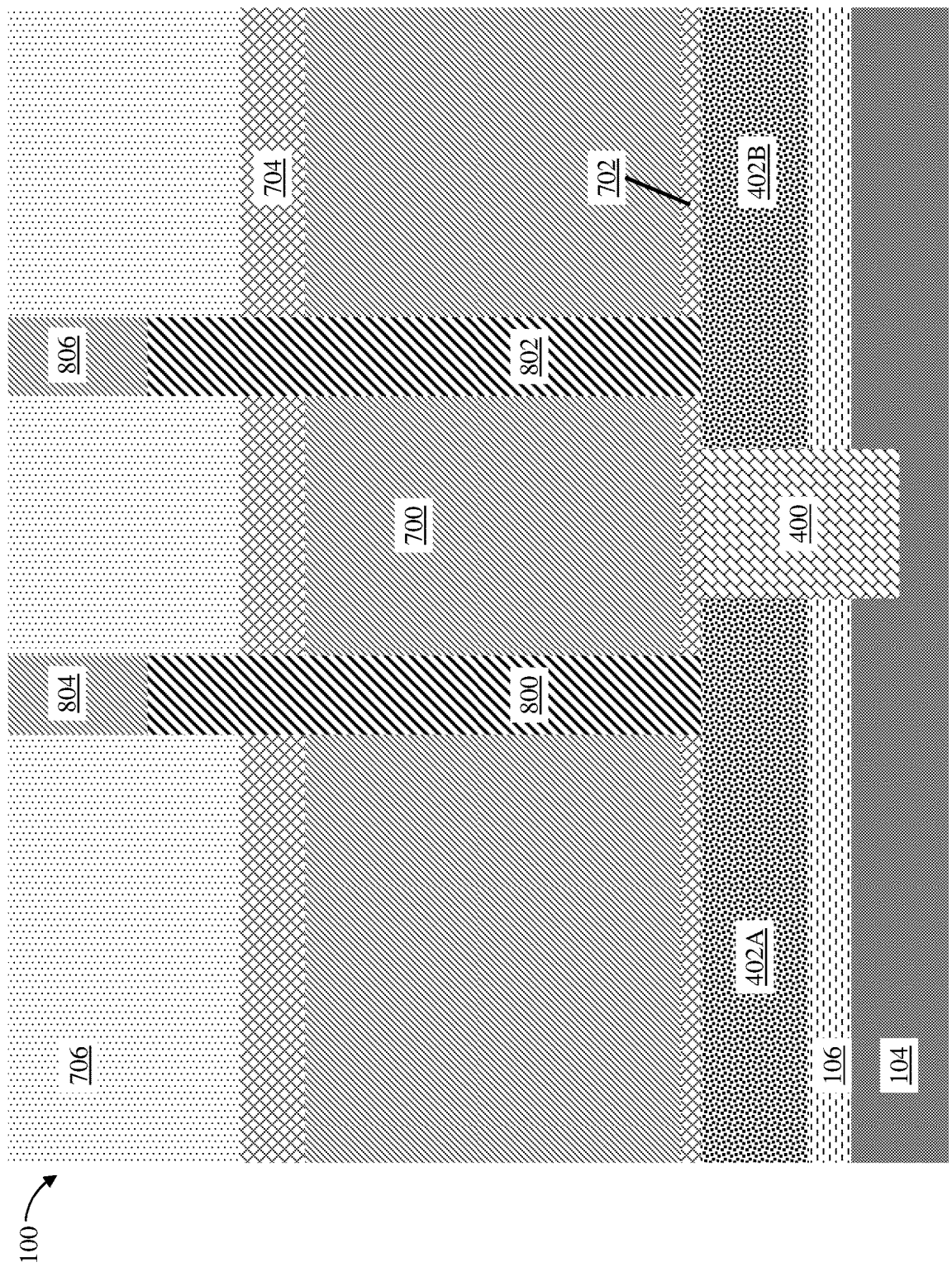
FIG. 8 depicts a cross-sectional view of the structure after forming a first semiconductor fin on the first portion of the doped layer and a second semiconductor fin on the second portion of the doped layer according to one or more embodiments of the present invention.

FIG. 8 illustrates a cross-sectional view of the structure 100 after forming a first semiconductor fin 800 on the first portion 402A of the doped layer 102 and a second semiconductor fin 802 on the second portion 402B of the doped layer 102. Any known composition and manner of forming the semiconductor fins 800 and 802 can be utilized. In some embodiments, portions of the sacrificial layer 706, the top spacer 704, the sacrificial gate 700, and the bottom spacer 702 are etched to expose portions of the doped layer 102. In some embodiments, the semiconductor fins 800 and 802 are epitaxially grown on the exposed portions of the doped layer 102. In some embodiments, exposed portions of the sacrificial gate 700 are oxidized to form a thin oxide layer (not illustrated) prior to forming the semiconductor fins 800 and 802. In some embodiments, the oxide layer can have a thickness of about 1 to about 3 nm.

The semiconductor fins 800 and 802 can be any suitable material, such as, for example, Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials. In some embodiments, a hard mask 804 is formed on a surface of the semiconductor fin 800 and a hard mask 806 is formed on a surface of the semiconductor fin 802. The hard masks 804 and 806 can be of any suitable material, such as, for example, a nitride or silicon nitride. In some embodiments, the fin pitch, or spacing, between the semiconductor fins 800 and 802 can be about 20 nm to about 100 nm. In other embodiments, the fin pitch is about 30 nm to about 50 nm.

Figure 9:
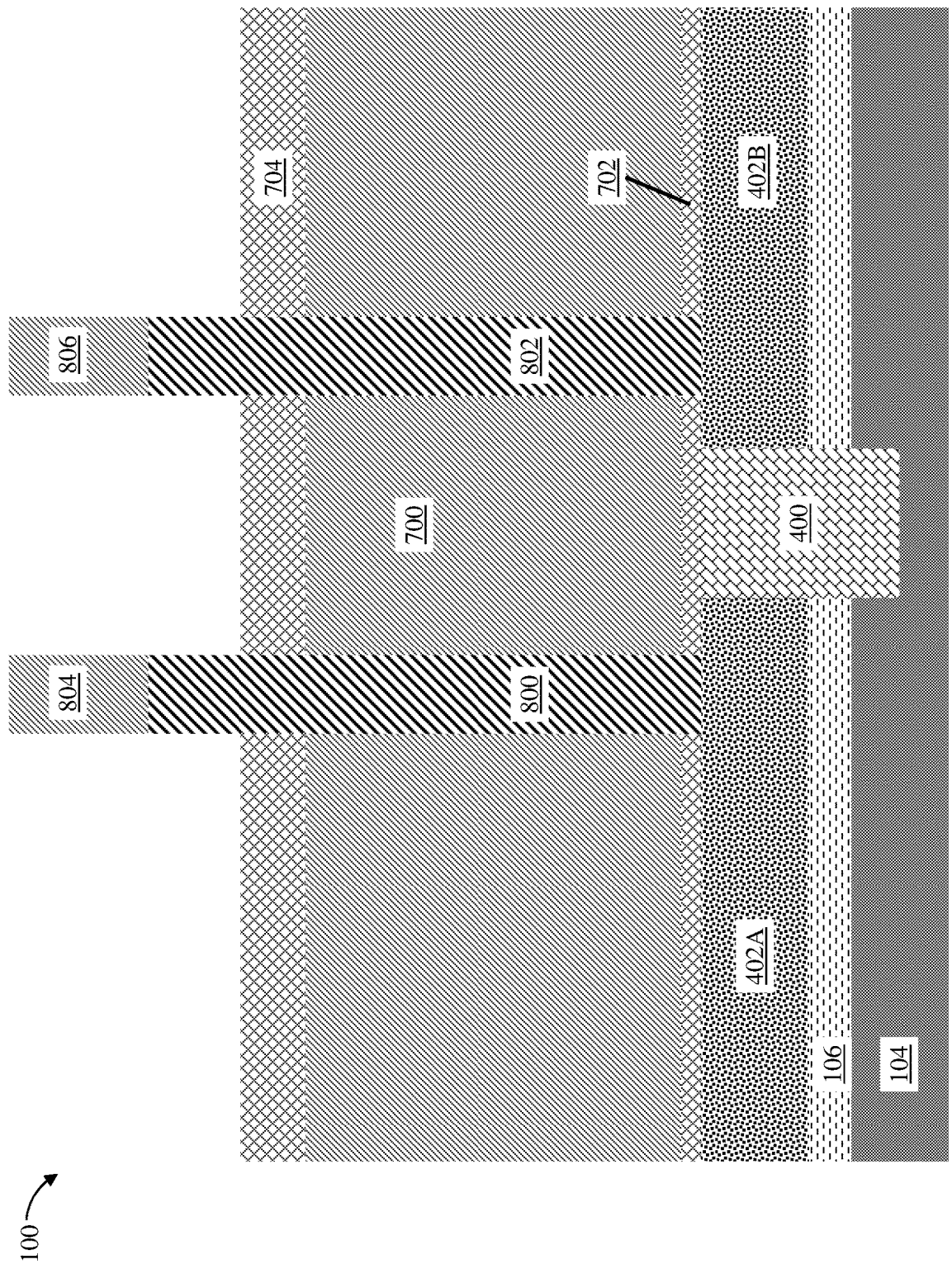
FIG. 9 depicts a cross-sectional view of the structure after removing the sacrificial layer to expose a surface of the top spacer according to one or more embodiments of the present invention.

FIG. 9 illustrates a cross-sectional view of the structure 100 after removing the sacrificial layer 706 to expose a surface of the top spacer 704. Any known manner of removing the sacrificial layer 706 can be utilized.

Figure 10:
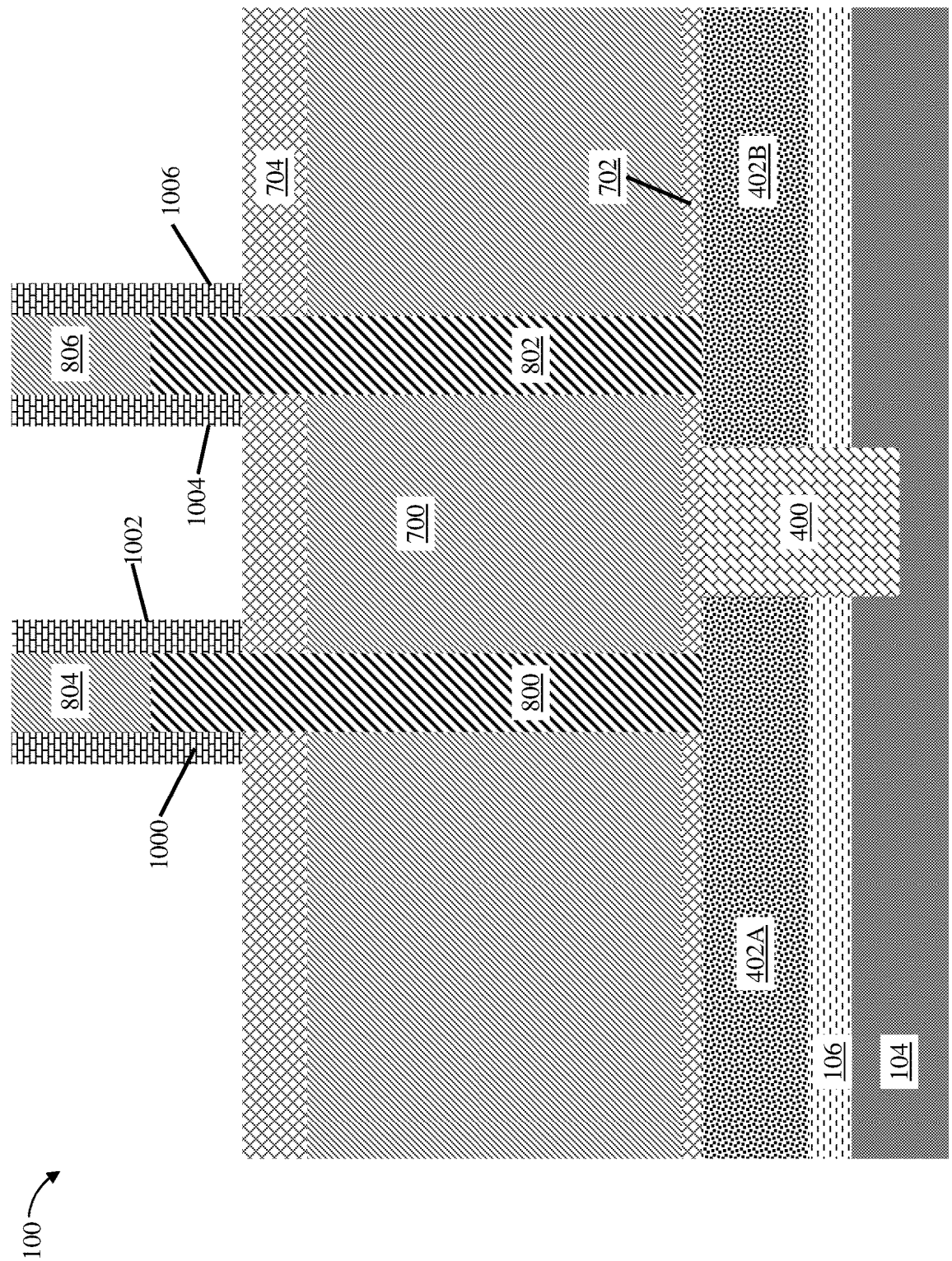
FIG. 10 depicts a cross-sectional view of the structure after forming sidewall spacers on opposite sidewalls of the semiconductor fin and the hard mask according to one or more embodiments of the present invention.

FIG. 10 illustrates a cross-sectional view of the structure 100 after forming sidewall spacers 1000 and 1002 on opposite sidewalls of the semiconductor fin 800 and the hard mask 804. Any known composition and manner of forming the sidewall spacers 1000 and 1002 can be utilized. In some embodiments, the sidewall spacers 1000 and 1002 are patterned by a sidewall image transfer (SIT) operation. In still other embodiments, the sidewall spacers 1000 and 1002 are patterned using a conformal layer deposition followed by a wet or dry etching process to selectively remove portions of the conformal layer. In some embodiments, the etching process is a RIE etch. In like composition and manner, sidewall spacers 1004 and 1006 are formed on opposite sidewalls of the semiconductor fin 802 and the hard mask 806.

Figure 11:
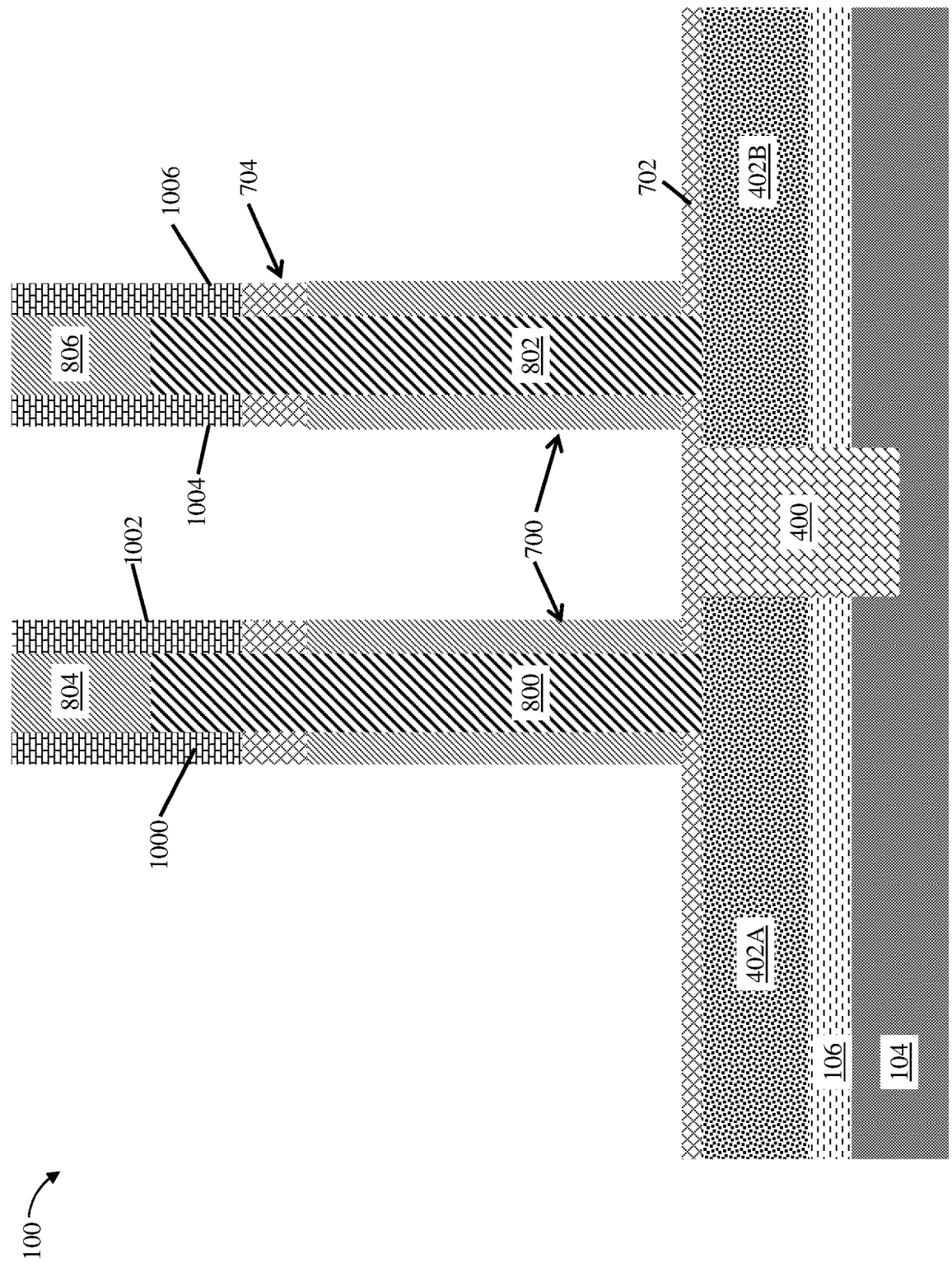
FIG. 11 depicts a cross-sectional view of the structure after removing portions of the sacrificial gate and portions of the top spacer to expose portions of the bottom spacer according to one or more embodiments of the present invention.

FIG. 11 illustrates a cross-sectional view of the structure 100 after removing portions of the sacrificial gate 700 and portions of the top spacer 704 to expose portions of the bottom spacer 702. Any known manner of removing the portions of the sacrificial gate 700 and the top spacer 704 can be utilized. In some embodiments, a wet or dry etching process selective to the bottom spacer 702 is utilized. In some embodiments, the etching process is a RIE etch.

Figure 12:
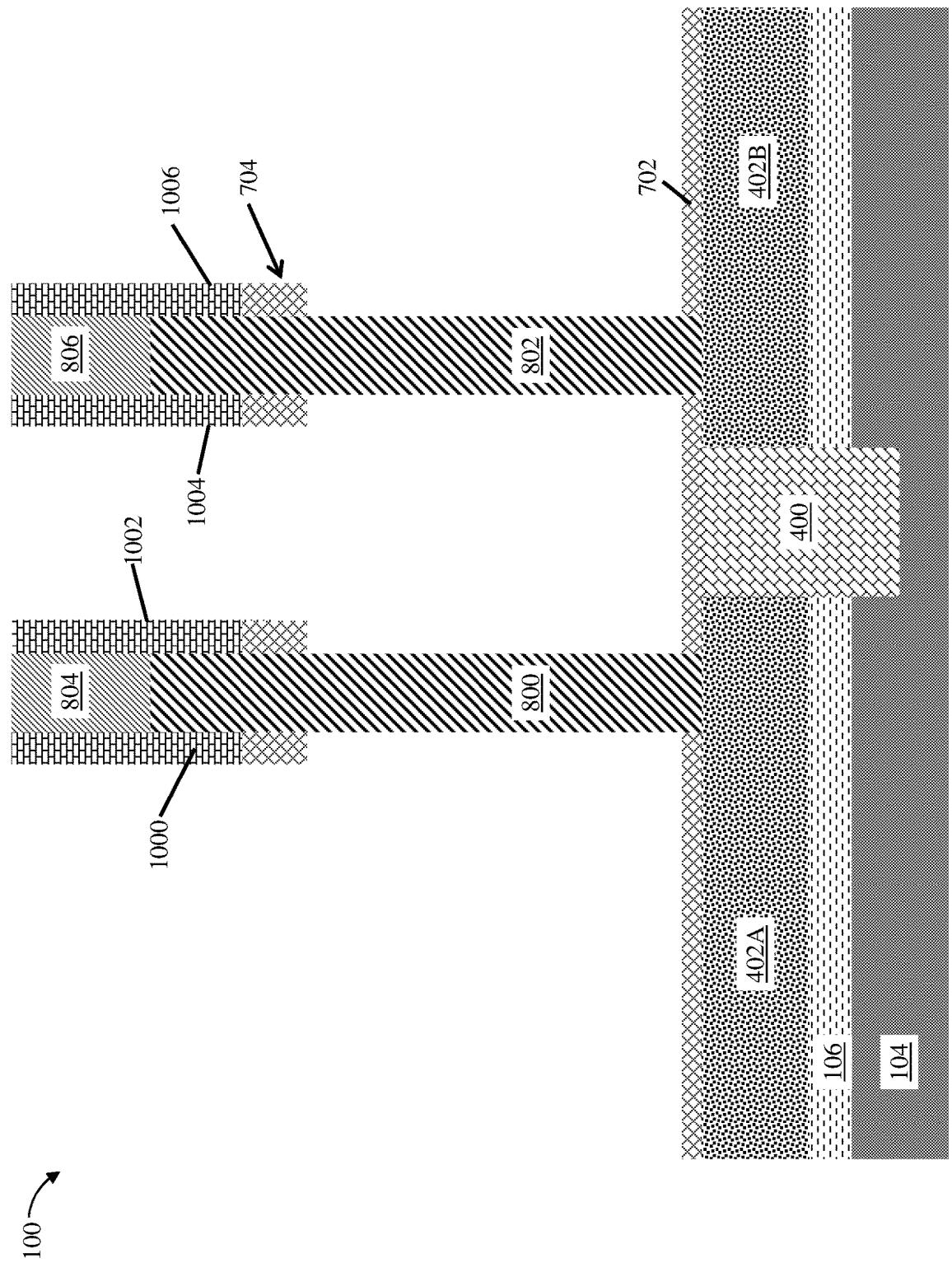
FIG. 12 depicts a cross-sectional view of the structure after removing the remaining portions of the sacrificial gate to expose sidewalls of the semiconductor fins according to one or more embodiments of the present invention.

FIG. 12 illustrates a cross-sectional view of the structure 100 after removing the remaining portions of the sacrificial gate 700 to expose sidewalls of the semiconductor fins 800 and 802. Any known manner of removing the remaining portions of the sacrificial gate 700 can be utilized. In some embodiments, a directional RIE etch is utilized to horizontally etch the remaining portions of the sacrificial gate 700.

Figure 13:
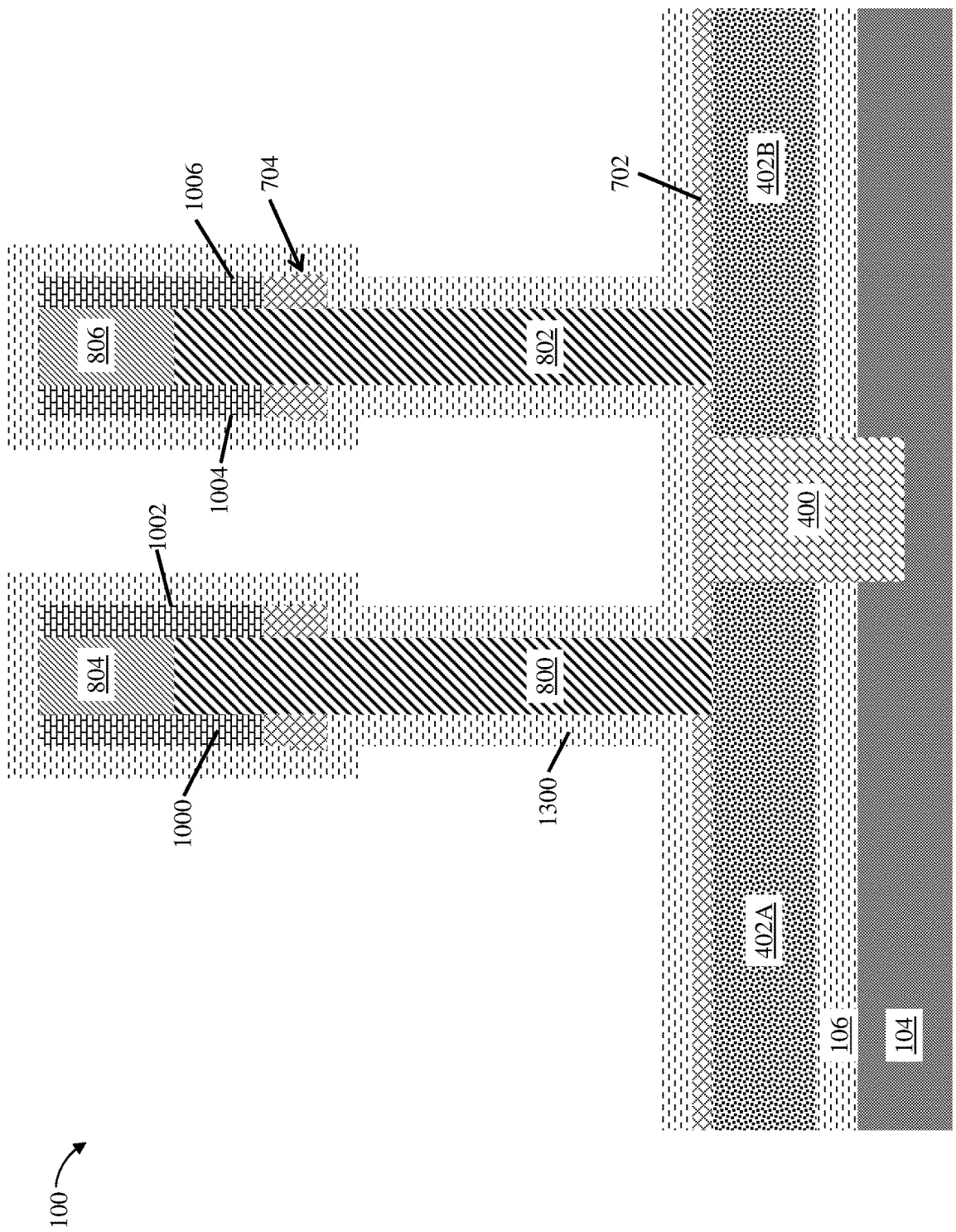
FIG. 13 depicts a cross-sectional view of the structure after forming a gate dielectric over exposed portions of the structure according to one or more embodiments of the present invention.

FIG. 13 illustrates a cross-sectional view of the structure 100 after forming a gate dielectric 1300 over exposed portions of the structure 100. The gate dielectric 1300 serves to modify the work function of the gate 1400 (illustrated in FIG. 14). Any known composition and manner of forming the gate dielectric 1300 can be utilized. In some embodiments, the gate dielectric 1300 is conformally deposited using, for example, ALD, over the exposed portions of the structure 100. The gate dielectric 1300 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the gate dielectric 1300 can have a thickness of about 0.5 nm to about 4 nm. In other embodiments, the gate dielectric 1300 can have a thickness of about 2 nm to about 3 nm.

Figure 14:
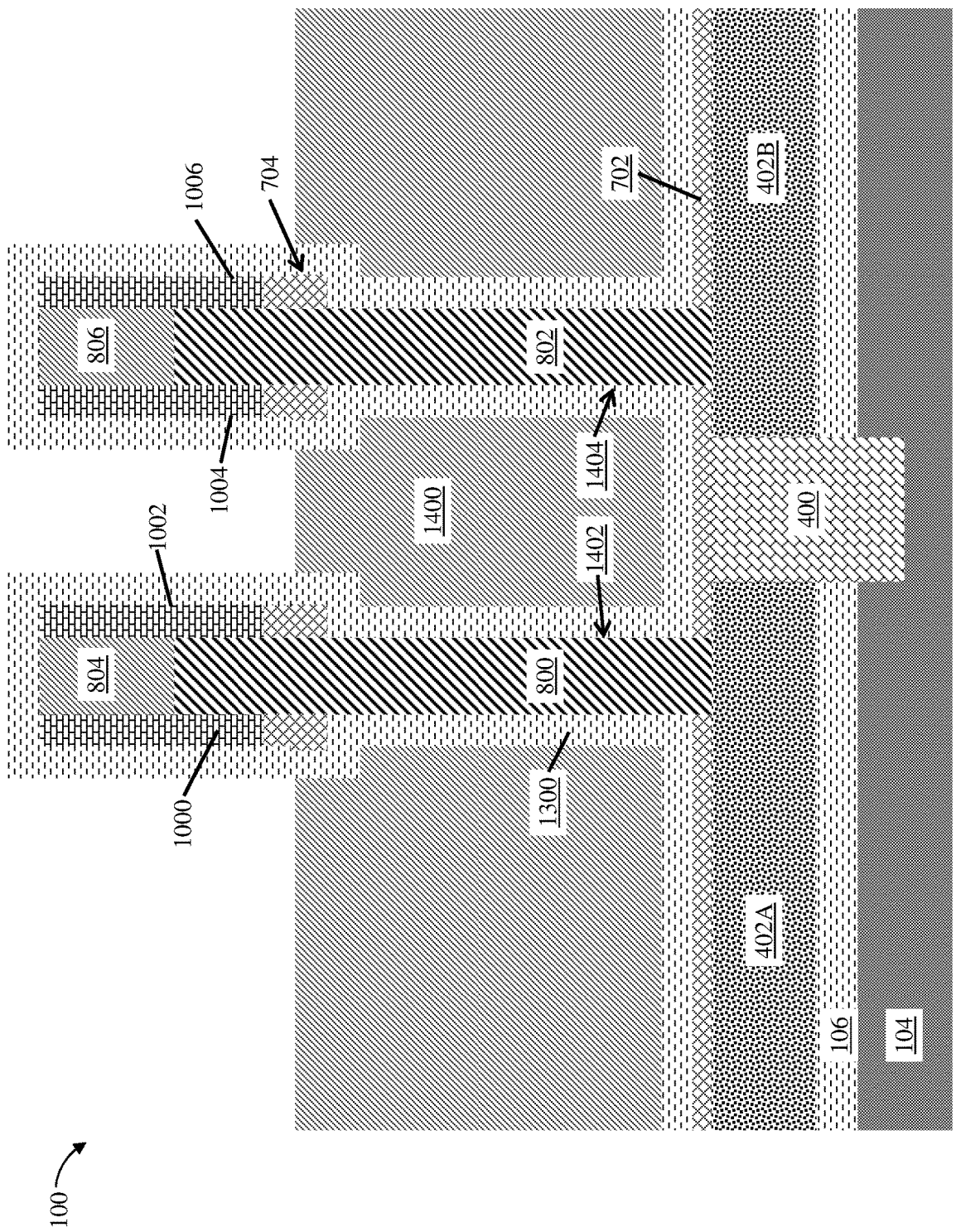
FIG. 14 depicts a cross-sectional view of the structure after forming a shared gate over a channel region of the first semiconductor fin and a channel region of the second semiconductor fin according to one or more embodiments of the present invention.

FIG. 14 illustrates a cross-sectional view of the structure 100 after forming a shared gate 1400 over a channel region 1402 of the first semiconductor fin 800 and a channel region 1404 of the second semiconductor fin 802. Any known composition and manner of forming the shared gate 1400 can be utilized. In some embodiments, the shared gate 1400 can be made of, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The gate can further include a work function metal layer next to the gate dielectric. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a CMP process is utilized to planarize a surface of the shared gate 1400. The CMP process can be selective to the gate dielectric 1300.

Figure 15:
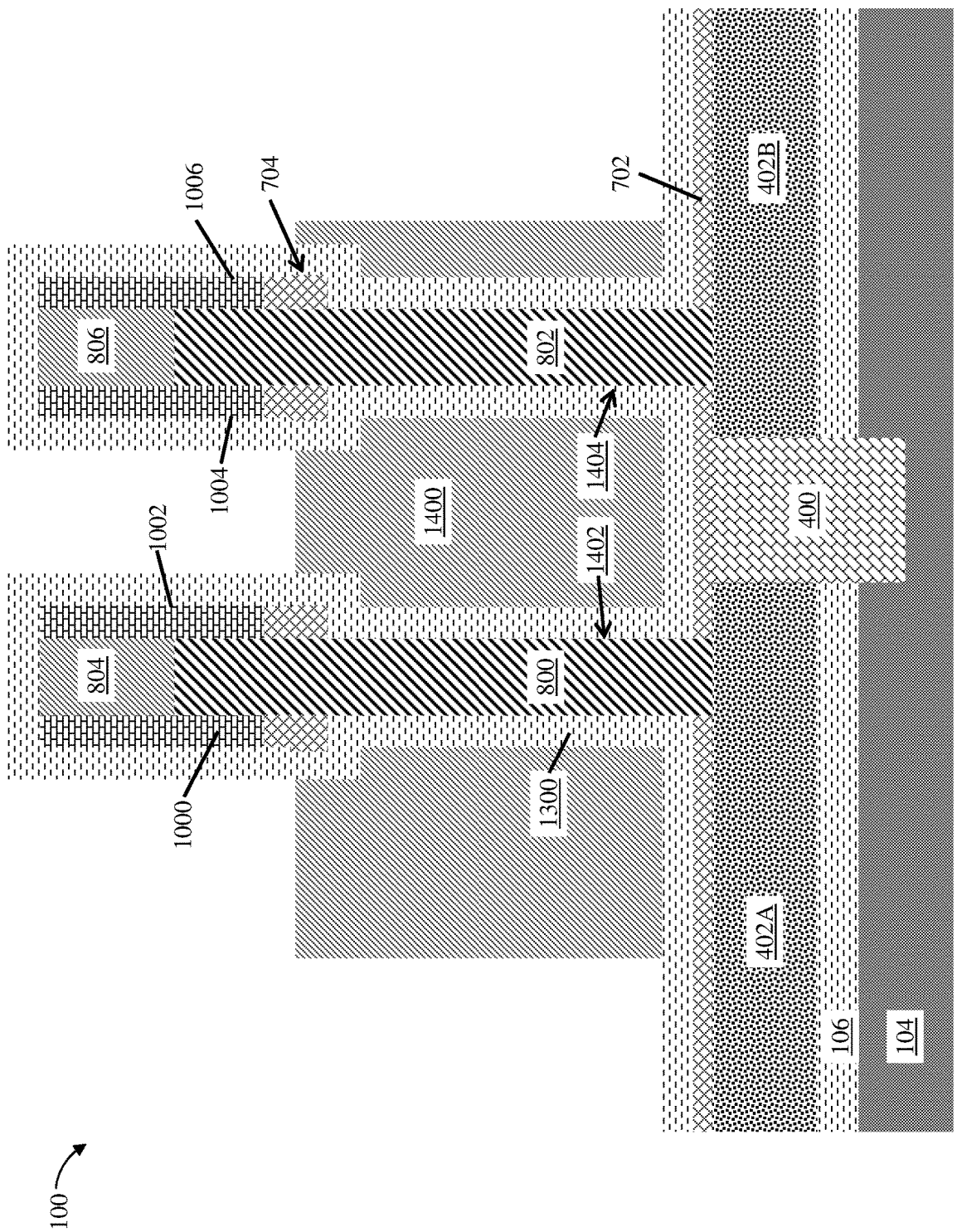
FIG. 15 depicts a cross-sectional view of the structure after patterning the shared gate according to one or more embodiments of the present invention.

FIG. 15 illustrates a cross-sectional view of the structure 100 after patterning the shared gate 1400 by removing portions of the shared gate 1400 to expose a surface of the gate dielectric 1300. Any known manner of removing portions of the shared gate 1400 can be utilized. In some embodiments, a wet or dry etching process selective to the gate dielectric 1300 is utilized. In some embodiments, the etching process is a RIE etch.

Figure 16:
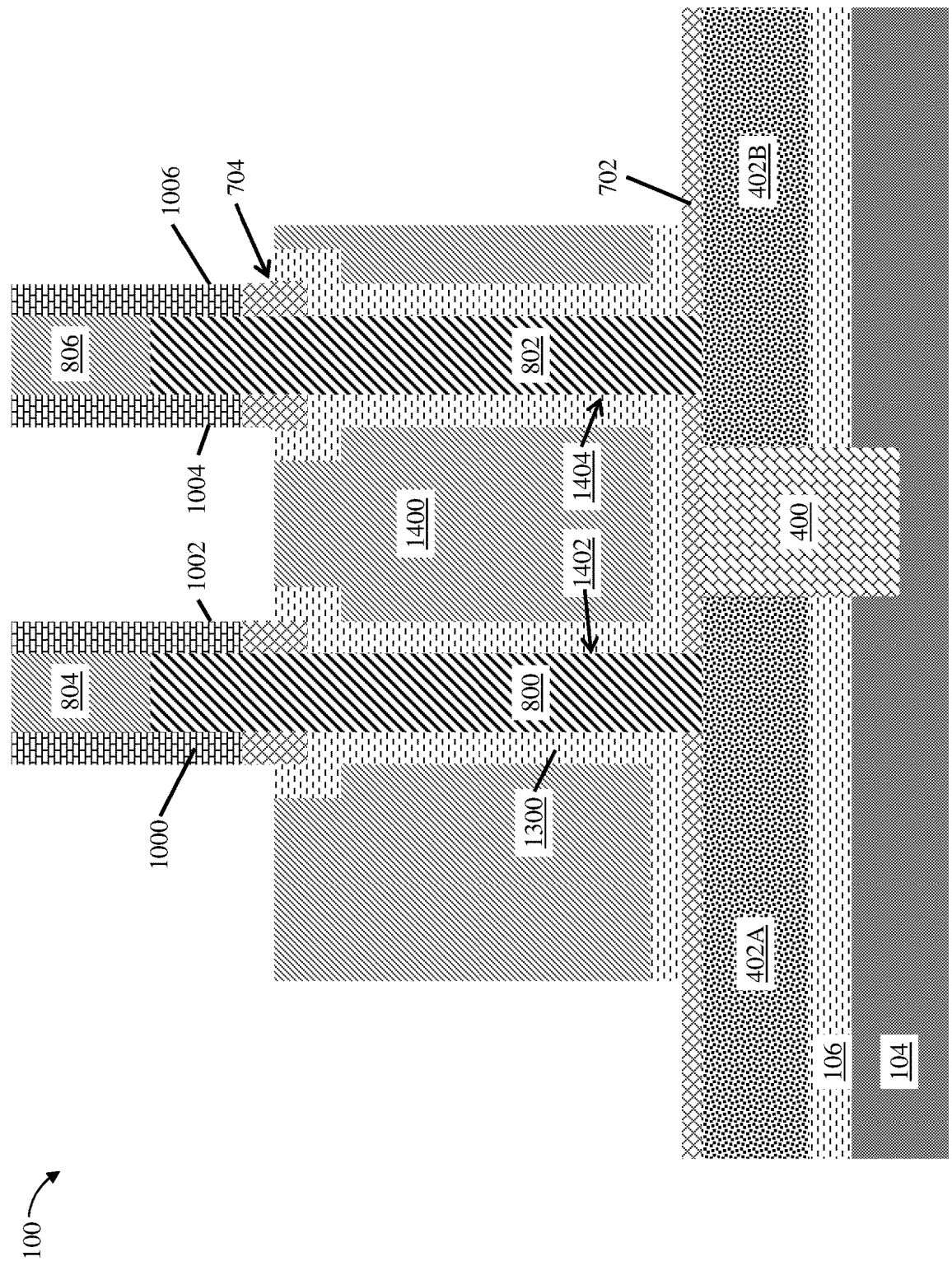
FIG. 16 depicts a cross-sectional view of the structure after patterning the gate dielectric according to one or more embodiments of the present invention.

FIG. 16 illustrates a cross-sectional view of the structure 100 after patterning the gate dielectric 1300 by removing portions of the gate dielectric 1300 to expose a surface of the bottom spacer 702, a portion of the top spacer 704, a surface of the sidewall spacers 1000, 1002, 1004, and 1006, and top surfaces of the hard masks 804 and 806. Any known manner of removing portions of the gate dielectric 1300 can be utilized. In some embodiments, a wet or dry etching process is utilized. In some embodiments, the etching process is a RIE etch.

Figure 17:
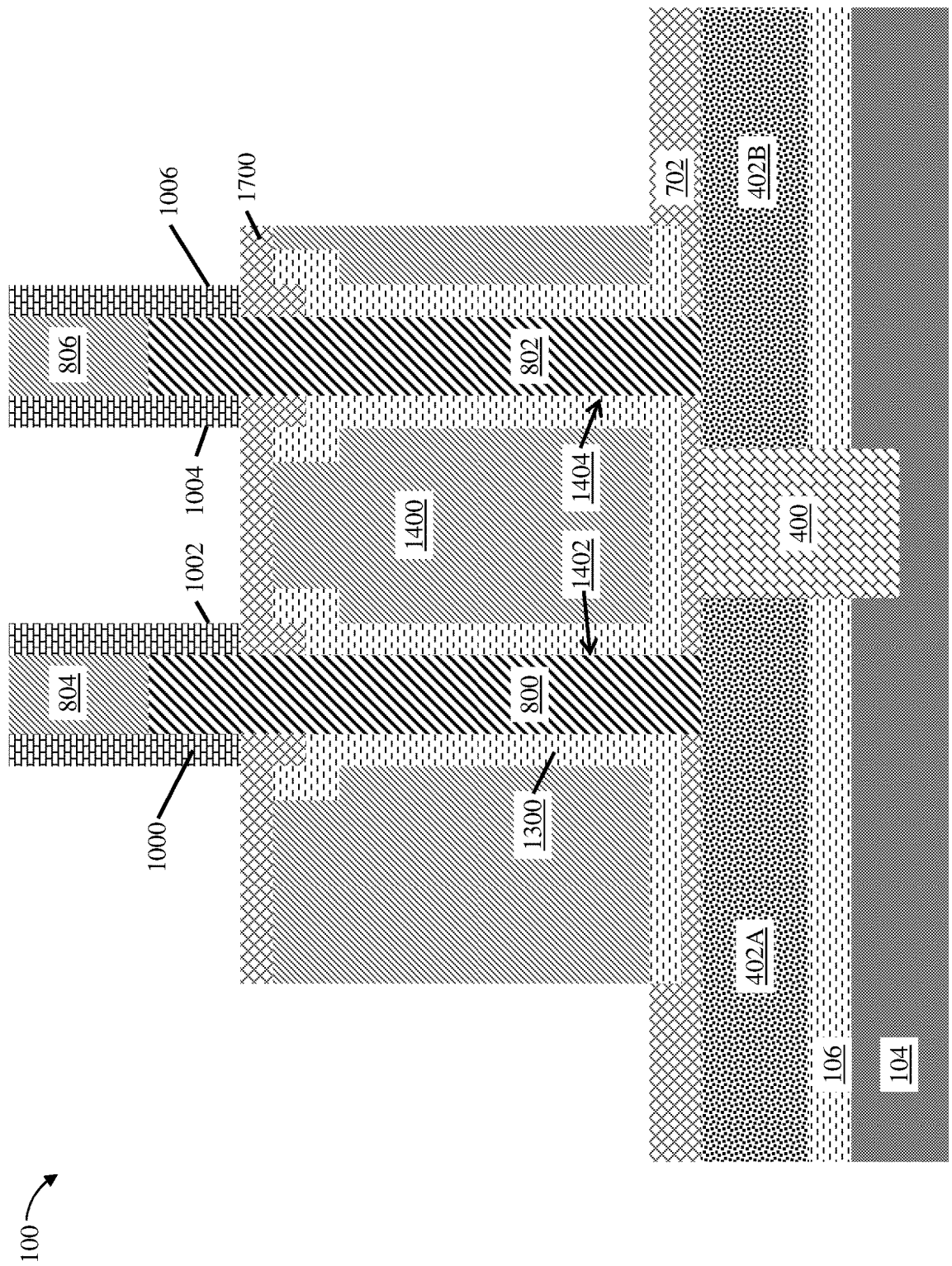
FIG. 17 depicts a cross-sectional view of the structure after forming a top spacer over exposed surfaces of the gate dielectric and exposed surfaces of the shared gate according to one or more embodiments of the present invention.

FIG. 17 illustrates a cross-sectional view of the structure 100 after forming a top spacer 1700 over exposed surfaces of the gate dielectric 1300 and exposed surfaces of the shared gate 1400. Any known composition and manner of forming the top spacer 1700 can be utilized. In some embodiments, the top spacer 1700 is deposited using CVD, PECVD, ALD, PVD, chemical solution deposition, or other like processes. The top spacer 1700 can be of any suitable material, such as, for example, a low-k dielectric, a nitride, silicon nitride, silicon oxide, a silicon oxynitride (SiON), a silicon carbide (SiC), a silicon oxygen carbonitride (SiOCN), or a silicoboron carbonitride (SiBCN). In some embodiments, the process of forming the top spacer 1700 results in depositing additional spacer material over the bottom spacer 702 to increase a thickness of the bottom spacer 702.

Figure 18:
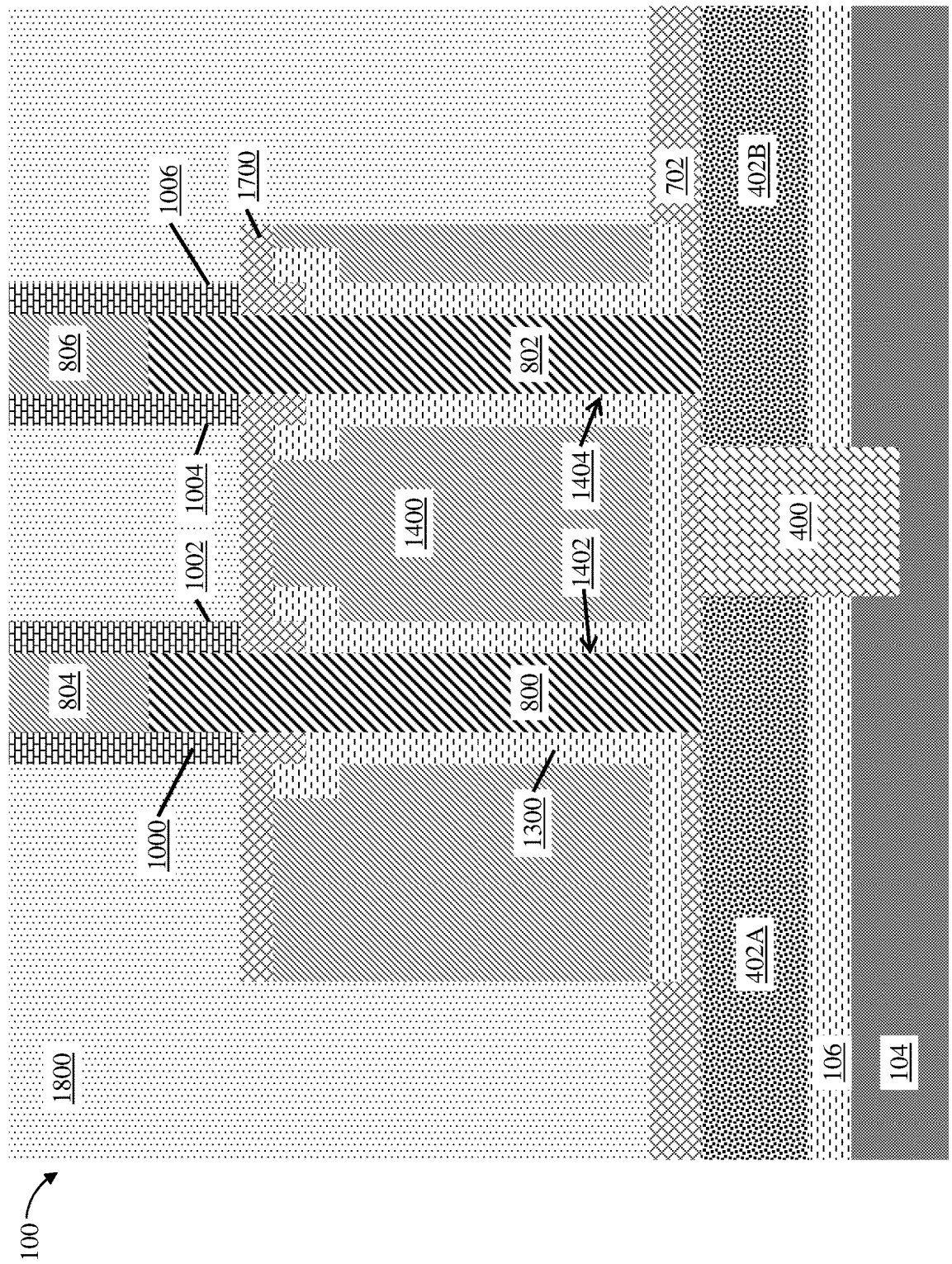
FIG. 18 depicts a cross-sectional view of the structure after forming an interlayer dielectric (ILD) according to one or more embodiments of the present invention.

FIG. 18 illustrates a cross-sectional view of the structure 100 after forming an interlayer dielectric (ILD) 1800 over exposed surfaces of the bottom spacer 702, the shared gate 1400, the top spacer 1700, the sidewall spacers 1000, 1002, 1004, and 1006 and the hard masks 804 and 806. Any known manner of forming the ILD 1800 can be utilized. The ILD 1800 can be formed using, for example, chemical vapor deposition (CVD), plasma enhanced chemical vapor deposition, atomic layer deposition, flowable CVD, spin-on dielectrics, or physical vapor deposition. The ILD 1800 can be any suitable material, such as, for example, porous silicates, carbon doped oxides, silicon oxides, silicon nitrides, silicon oxynitrides, or other dielectric materials.

Figure 19:
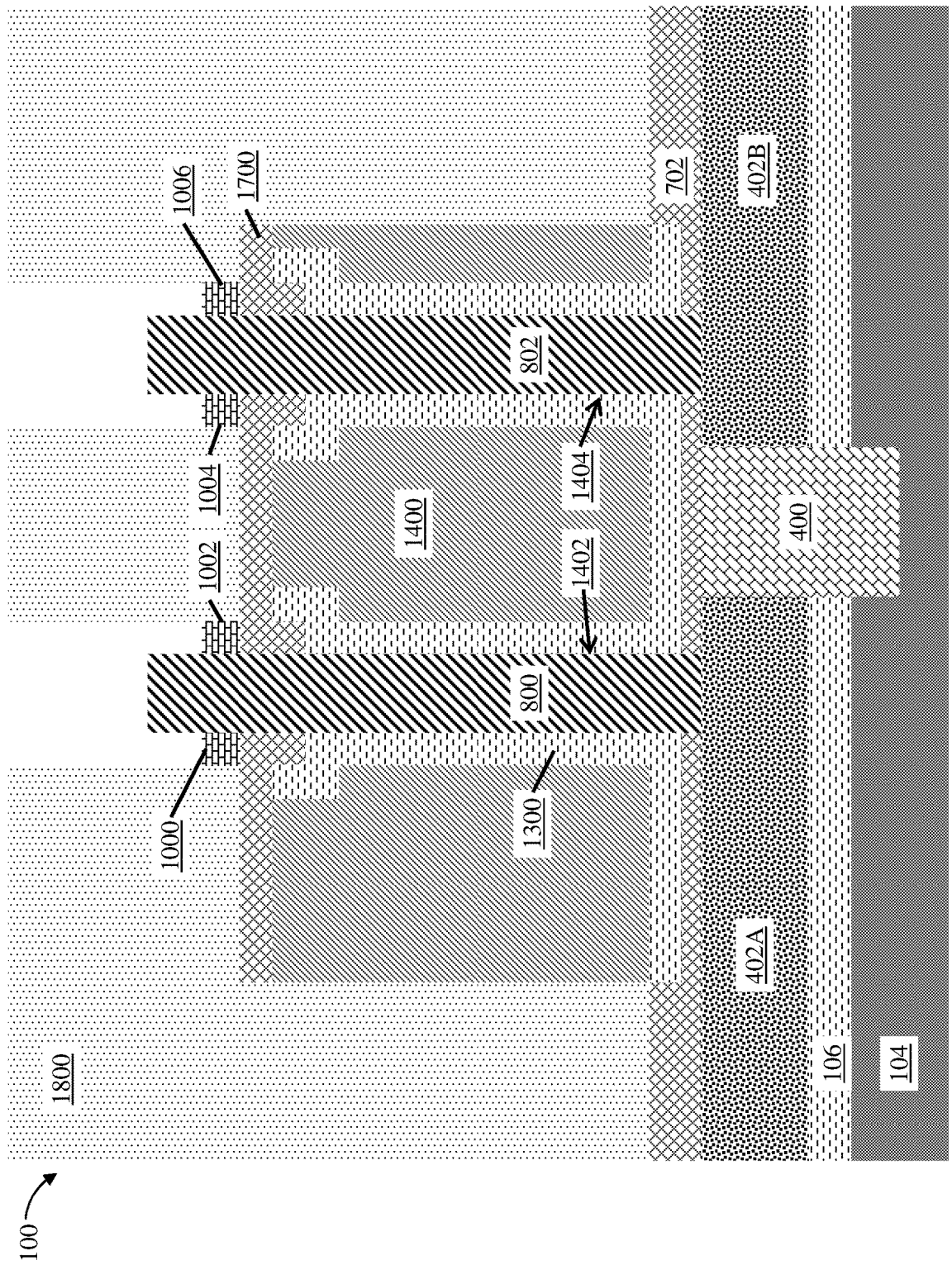
FIG. 19 depicts a cross-sectional view of the structure after removing the hard masks and portions of the sidewall spacers to expose a surface and sidewalls of the semiconductor fins according to one or more embodiments of the present invention.

FIG. 19 illustrates a cross-sectional view of the structure 100 after removing the hard masks 804 and 806 and portions of the sidewall spacers 1000, 1002, 1004, and 1006 to expose a surface and sidewalls of the semiconductor fins 800 and 802. Any known manner of removal, such as a wet or dry etch process, can be utilized.

Figure 20:
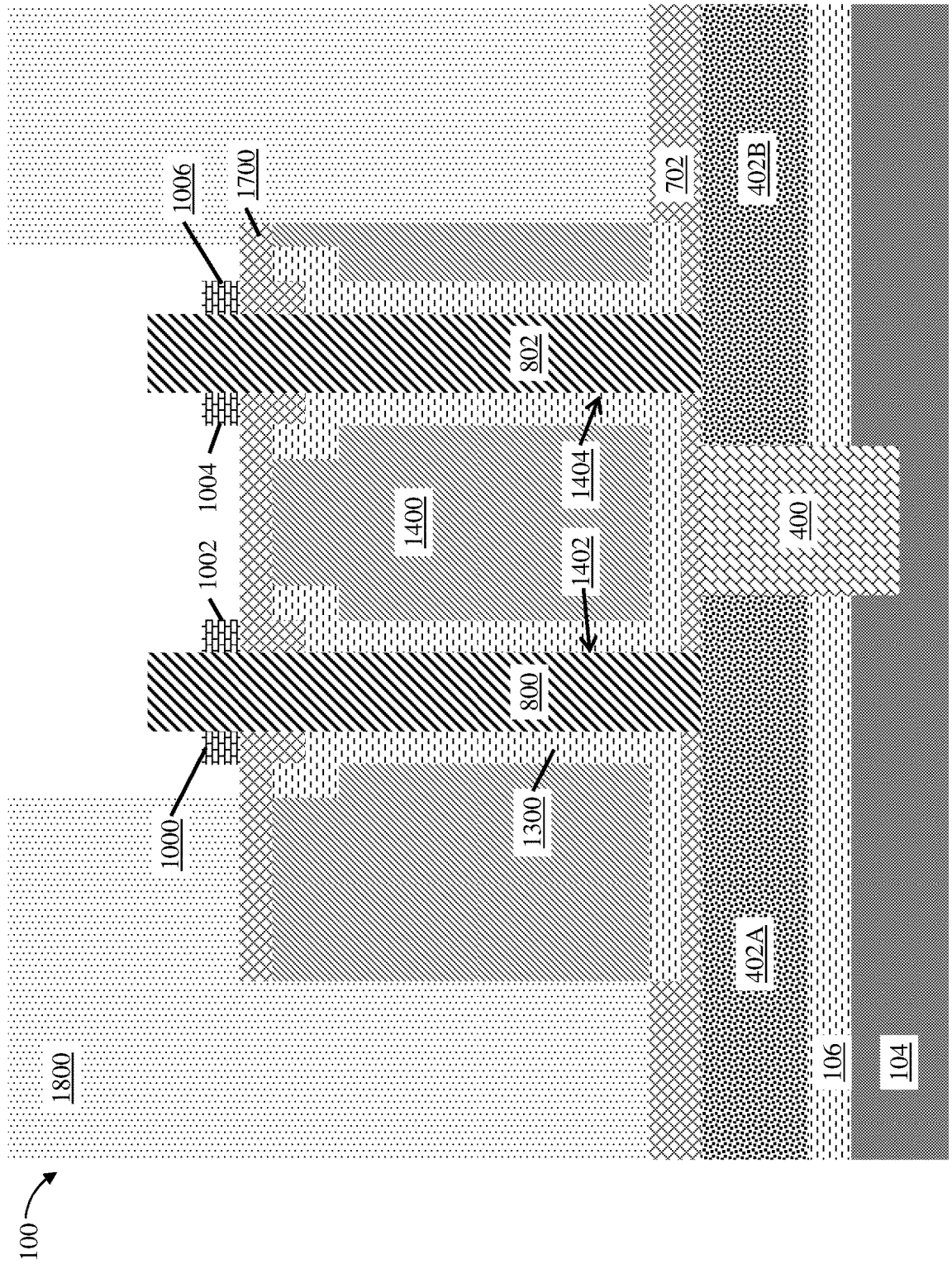
FIG. 20 depicts a cross-sectional view of the structure after removing a portion of the ILD to expose a surface of the top spacer between the semiconductor fins according to one or more embodiments of the present invention.

FIG. 20 illustrates a cross-sectional view of the structure 100 after removing a portion of the ILD 1800 to expose a surface of the top spacer 1700 between the semiconductor fins 800 and 802. In some embodiments, an additional portion of the ILD 1800 is removed to expose sidewalls of the sidewall spacers 1000 and 1006. Any known manner of removal, such as a wet or dry etch process, can be utilized.

Figure 21:
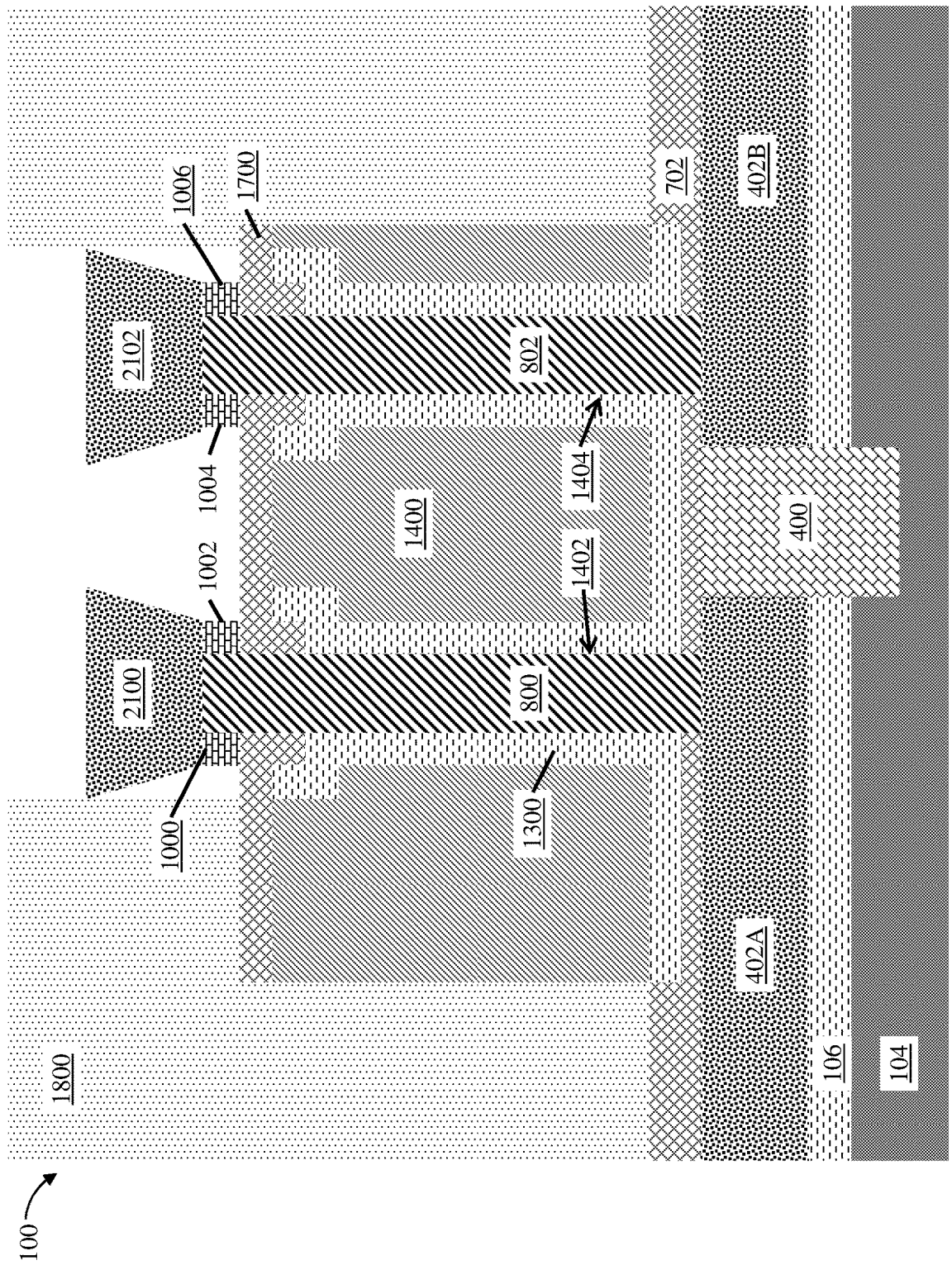
FIG. 21 depicts a cross-sectional view of the structure after forming a first epitaxy region on a surface of the first semiconductor fin and a second epitaxy region on a surface of the second semiconductor fin according to one or more embodiments of the present invention.

In some embodiments, a pre-cleaning process is used to remove any native oxide and any other impurities or contaminants on the exposed surfaces of the semiconductor fins 800 and 802 prior to forming first and second epitaxy regions 2100 and 2102 (illustrated in FIG. 21). In some embodiments, a wet etch system is used to pre-clean. In some embodiments, the wet etch system is a buffered hydrofluoric acid (BHF) etch. BHF is a mixture of a buffering agent and hydrofluoric acid (HF). The buffering agent provides a greater process control than HF alone and can be, for example, ammonium fluoride ($NH_4F$). Wet etch processes, such as BHF, can advantageously remove native silicon oxide or silicon nitride films during an epitaxy pre-clean.

In other embodiments, a dry etch system is used to pre-clean. In some embodiments, the dry etch system includes an in-situ remote plasma assisted dry etch process. In-situ remote plasma assisted dry etch processes involve the simultaneous exposure of a substrate to $H_2$, $NF_3$ and $NH_3$ plasma by-products. Remote plasma excitation of the hydrogen and fluorine species allows plasma-damage-free substrate processing. The resulting etch is largely conformal and selective towards silicon oxide layers but does not readily etch silicon regardless of whether the silicon is amorphous, crystalline or polycrystalline. This selectivity provides advantages for applications such as shallow trench isolation (STI) and ILD recess formation and cleaning. A dry etch process can produce solid by-products which grow on the surface of the substrate as substrate material is removed. These solid by-products can be subsequently removed via sublimation when the temperature of the substrate is raised.

FIG. 21 illustrates a cross-sectional view of the structure 100 after forming a first epitaxy region 2100 on a surface of the first semiconductor fin 800 and a second epitaxy region 2102 on a surface of the second semiconductor fin 802. The first and second epitaxy regions 2100 and 2102 can be source or drain regions formed by a variety of methods, such as, for example, in-situ doping during epitaxial growth and/or diffusion and/or ion implantation. In some embodiments, the first and second epitaxy regions 2100 and 2012 are formed by a process including, but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. Epitaxial materials can be grown from gaseous or liquid precursors. Epitaxial materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. In some embodiments, the dopant concentration in the first and second epitaxy regions 2100 and 2102 can range from $1 \times 10^{19}$ $cm^{-3}$ to $3 \times 10^{21}$ $cm^{-3}$, or preferably between $1 \times 10^{20}$ $cm^{-3}$ and $1.5 \times 10^{21}$ $cm^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, germaniumtetrachloride, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the first and second epitaxy regions 2100 and 2102 include silicon or carbon doped silicon (Si:C). In some embodiments, a Si:C layer can be grown in the same chamber used for other epitaxy steps or in a dedicated Si:C epitaxy chamber. The Si:C can include carbon in the range of 0.2% to 2.5%.

Figure 22:
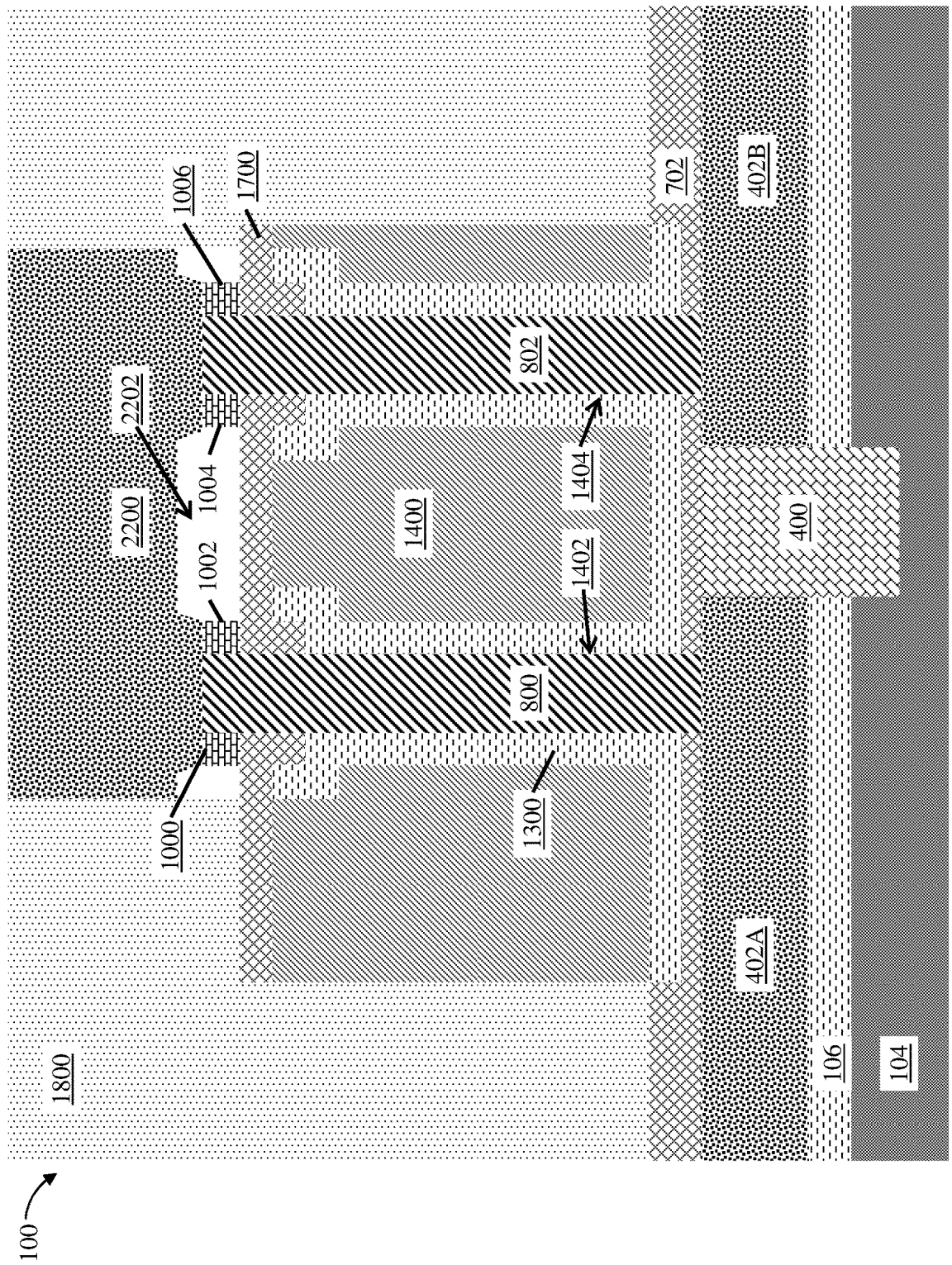
FIG. 22 depicts a cross-sectional view of the structure after growing the first and second epitaxy regions until the regions merge to form a shared epitaxy region according to one or more embodiments of the present invention.

FIG. 22 illustrates a cross-sectional view of the structure 100 after growing the first and second epitaxy regions 2100 and 2102 until the regions merge to form a shared epitaxy region 2200. In some embodiments, the shared epitaxy region 2200 can be overgrown above a top surface of the ILD 1800. In some embodiments, a CMP selective to the ILD 1800 is used to remove any excess portion of the shared epitaxy region 2200 that extends above the top surface of the ILD 1800. In some embodiments, the shared epitaxy region 2200 is a floating epitaxy having a gap 2202 separating the shared epitaxy region 2200 from the shared gate 1400. Merging the first and second epitaxy regions 2100 and 2102 to form the shared epitaxy region 2200 allows for the semiconductor fins 800 and 802 to be electrically connected in series. As previously noted herein, the semiconductor fins 800 and 802, having a shared epitaxy region and a shared gate, are said to be "stacked" VFETs connected in series because the semiconductor fins 800 and 802 can be operated as a single transistor.

Figure 23:
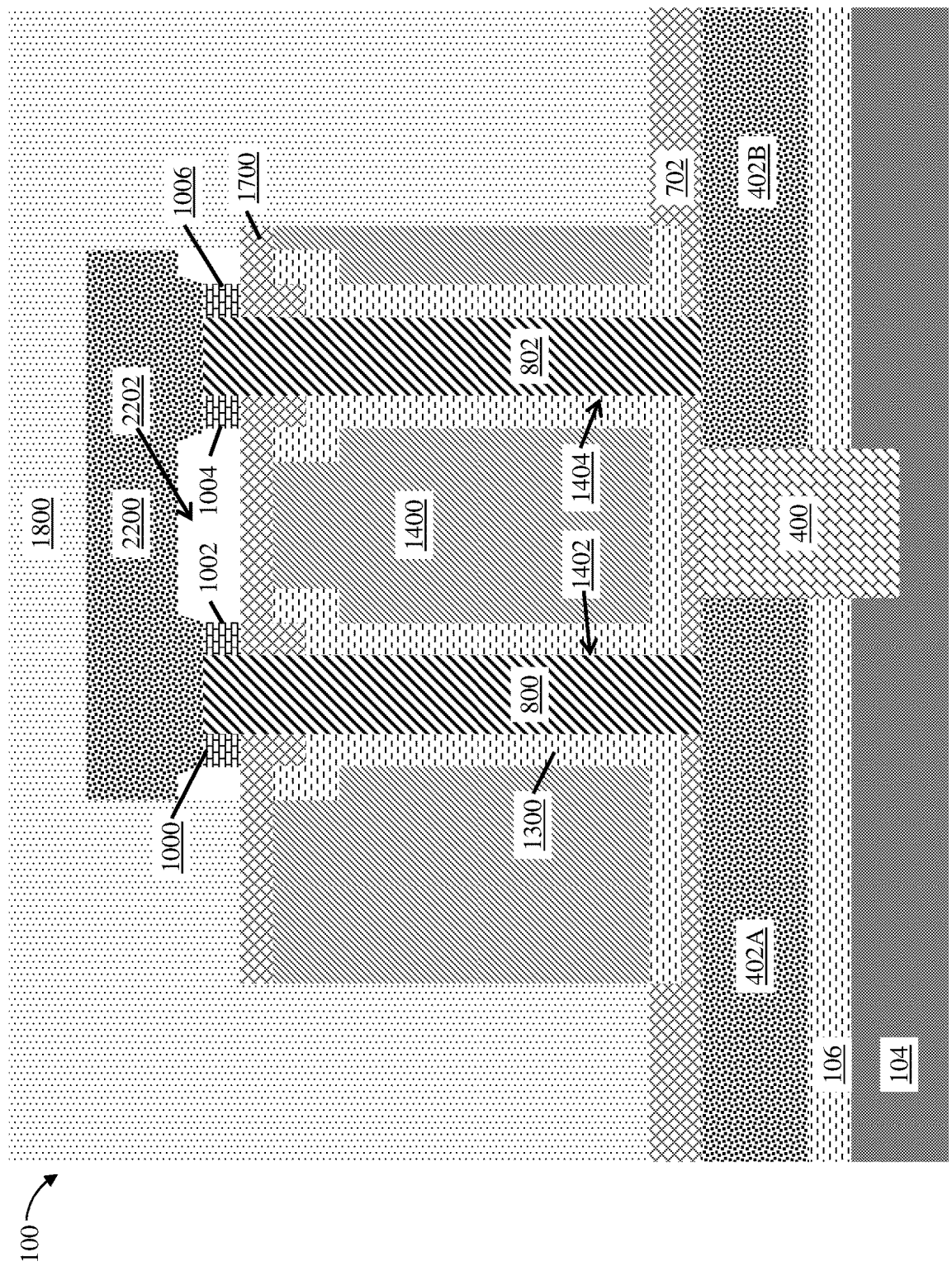
FIG. 23 depicts a cross-sectional view of the structure after recessing the shared epitaxy region and replacing with additional ILD material according to one or more embodiments of the present invention.

FIG. 23 illustrates a cross-sectional view of the structure 100 after recessing the shared epitaxy region 2200 and replacing with additional ILD 1800 material. Any known manner of recessing the shared epitaxy region 2200, such as, for example, a wet or dry etch process, can be utilized.

Figure 24:
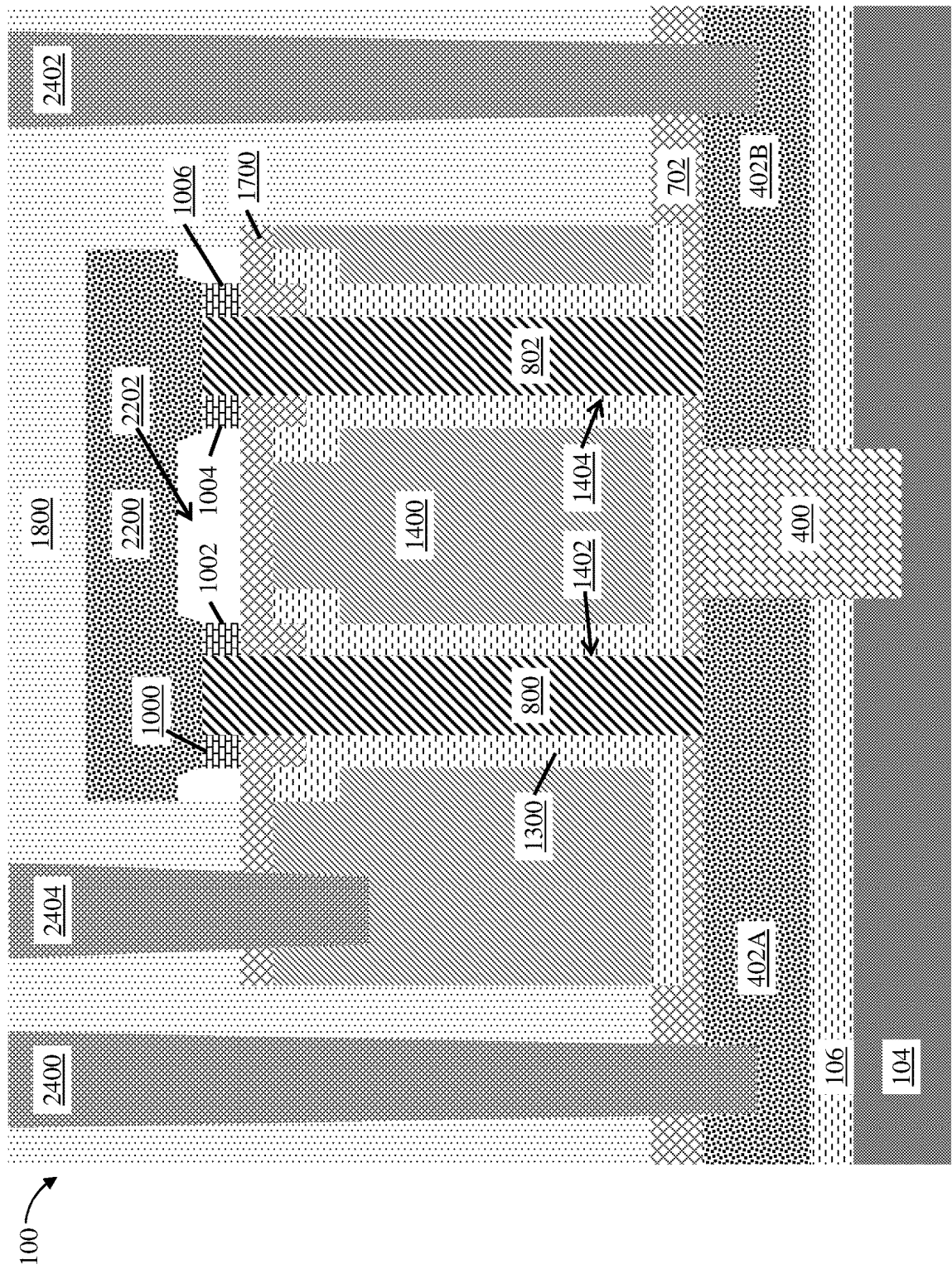
FIG. 24 depicts a cross-sectional view of the structure after forming a first contact in the first portion of the doped layer and a second contact in the second portion of the doped layer according to one or more embodiments of the present invention.

FIG. 24 illustrates a cross-sectional view of the structure 100 after forming a first contact 2400 in the first portion 402A of the doped layer 102 and a second contact 2402 in the second portion 402B of the doped layer 102. In some embodiments, the first contact 2400 is electrically coupled to a positive supply voltage (also known as a power supply voltage, not illustrated). In some embodiments, the second contact 2400 is electrically coupled to the positive supply voltage. In some embodiments, the positive supply voltage is greater than about 1 volt.

The first contact 2400 and the second contact 2402 can be of any suitable conducting material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. Any known manner of forming the first contact 2400 and the second contact 2402 can be utilized. In some embodiments, the first contact 2400 can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

A gate contact 2404 is formed in the shared gate 1400. The gate contact 2404 allows for control over a current which can flow between the first contact 2400 and the second contact 2402. As the semiconductor fins 800 and 802 are connected in series and operated as a single transistor, the current flows in one embodiment from the first portion 402A of the doped layer 102, up the semiconductor fin 800, across the shared epitaxy region 2200, down the semiconductor fin 802, and across the second portion 402B of the doped layer 102. As such, the current flows over a channel having a longer channel length than is otherwise available for typical VFETs and the structure 100 is consequently capable of operating with a significantly larger power supply voltage than typical VFETs.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
   forming a first vertical semiconductor fin and a second vertical semiconductor fin on a doped region of a substrate;
   forming a shared gate over a channel region of the first vertical semiconductor fin and a channel region of the second vertical semiconductor fin;

forming a first upper surface of the first vertical semiconductor fin and a second surface of the second vertical semiconductor fin each above an upper surface of the shared gate; and growing first and second epitaxy regions from the first and second upper surfaces and across the shared gate from the first upper surface to the second upper surface so as to form the air gap between the shared epitaxy region and a surface of the shared gate to form a floating shared epitaxy region on a top surface of the first vertical semiconductor fin and a top surface of the second vertical semiconductor fin such that the shared gate is below the shared epitaxy region and is interposed between the shared epitaxy region and the doped region of the substrate, the floating shared epitaxy region having an air gap between a lower epitaxy surface and the shared gate, wherein the floating shared epitaxy region connects the first and second vertical semiconductor fins are in series and excludes a contact formed thereon so to define a channel that extends from the first vertical semiconductor fin through the floating shared epitaxy region and to the second vertical semiconductor fin.

2. The method of claim 1, further comprising:
growing the first and the second epitaxy regions until the first epitaxy region merges with the second epitaxy region.

3. The method of claim 1, wherein the doped region comprises a first portion and a second portion, the first semiconductor fin formed on the first portion and the second semiconductor fin formed on the second portion; further comprising forming a shallow trench isolation region in the substrate, the shallow trench isolation region between the first portion and the second portion of the doped region.

4. The method of claim 1, further comprising:
forming a first contact in the first portion of the doped region; wherein the first contact is electrically coupled to a positive supply voltage;
forming a second contact in the second portion of the doped region without forming a contact in the shared epitaxy region such that a current flows between the first contact and the second contact thereby forming a serial connection between the first contact, first vertical semiconductor fin, the second vertical semiconductor fin, and the second contact.

5. The method of claim 4, wherein the positive supply voltage is greater than about 1 volt.

6. A method for forming a semiconductor device, the method comprising:
forming a first vertical semiconductor fin on a first portion of a doped region of a substrate;
forming a second vertical semiconductor fin on a second portion of the doped region of the substrate;
forming a gate over a channel region of the first vertical semiconductor fin and a channel region of the second vertical semiconductor fin;
forming a first top surface of the first vertical semiconductor fin and a second top surface of the second vertical semiconductor fin each above an upper surface of the shared gate;
forming a first epitaxy region on the first top surface of the first vertical semiconductor fin;
forming a second epitaxy region on the second top surface of the second vertical semiconductor fin; and
growing the first and the second epitaxy regions across the shared gate until the first epitaxy region merges with the second epitaxy region to define a floating shared epitaxy region such that the gate is below the shared epitaxy region and is interposed between the shared epitaxy region and the doped region of the substrate, the floating shared epitaxy region having an air gap between a lower epitaxy surface and the gate, wherein the floating shared epitaxy region connects the first and second vertical semiconductor fins in series such that an applied current flows serially from the first portion of the doped region through the channel region of the first vertical semiconductor fin, across the shared epitaxy region, and through the channel region of the second vertical semiconductor fin to the second portion of the doped region.

7. The method of claim 6, further comprising forming a shallow trench isolation region in the substrate, the shallow trench isolation region between the first portion and the second portion of the doped region.

8. The method of claim 7, further comprising:
forming a first contact in the first portion of the doped region; and
forming a second contact in the second portion of the doped region;
wherein the floating shared epitaxy region excludes a contact such that a current flows between the first contact and the second contact thereby forming a serial connection between the first contact, first vertical semiconductor fin, the second vertical semiconductor fin, and the second contact.

9. The method of claim 8, wherein the second contact is electrically coupled to a positive supply voltage.

10. The method of claim 9, wherein the positive supply voltage is greater than about 1 volt.

11. A method for forming a semiconductor device, the method comprising:
forming a first vertical semiconductor fin and a second vertical semiconductor fin on a doped region of a substrate;
forming a shared gate over a channel region of the first vertical semiconductor fin and a channel region of the second vertical semiconductor fin;
forming a first upper surface of the first vertical semiconductor fin and a second surface of the second vertical semiconductor fin each above an upper surface of the shared gate; and
growing first and second epitaxy regions from the first and second upper surfaces and across the shared gate from the first upper surface to the second upper surface so as to form the air gap between the shared epitaxy region and a surface of the shared gate to form a shared epitaxy region having an air gap between a lower epitaxy surface and the shared gate, the shared epitaxy region on a top surface of the first vertical semiconductor fin and a top surface of the second vertical semiconductor fin such that the shared gate is below the shared epitaxy region and is interposed between the shared epitaxy region and the doped region of the substrate;
forming a first contact in the first portion of the doped region; wherein the first contact is electrically coupled to a positive supply voltage; and
forming a second contact in the second portion of the doped region without forming a contact in the shared epitaxy region such that a current flows between the first contact and the second contact thereby forming a serial connection between the first contact, first vertical semiconductor fin, the second vertical semiconductor fin, and the second contact.

* * * * *